(12) United States Patent  
Suehiro

(10) Patent No.: US 7,692,259 B2  
(45) Date of Patent: Apr. 6, 2010

(54) SOLID-STATE ELEMENT DEVICE

(75) Inventor: Yoshinobu Suehiro, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 792 days.

(21) Appl. No.: 11/516,682

(22) Filed: Sep. 7, 2006

(65) Prior Publication Data

US 2007/0058059 A1    Mar. 15, 2007

(30) Foreign Application Priority Data

Sep. 7, 2005  (JP) ............................. 2005-259845  
Aug. 3, 2006  (JP) ............................. 2006-212630

(51) Int. Cl.  
    H01L 27/14   (2006.01)  
    H01L 31/00   (2006.01)

(52) U.S. Cl. ................ 257/431; 257/433; 257/E31.127

(58) Field of Classification Search ............... 257/79, 257/80, 81, 414, 431, 432, 433, E31.127, 257/E33.001

See application file for complete search history.

(56) References Cited

U.S. PATENT DOCUMENTS 7,382,033 B2 *  6/2008  Roth et al. ................. 257/432  
2006/0113906 A1   6/2006  Ogawa

FOREIGN PATENT DOCUMENTS

JP    2003-218403    7/2003  
JP    2006-156668    6/2006

* cited by examiner

Primary Examiner—Hoai v Pham  
(74) Attorney, Agent, or Firm—McGinn IP Law Group, PLLC

(57) ABSTRACT

A solid-state element device having: a solid-state element having a pad electrode smaller than a contact electrode, the solid-state element being flip-mounted; a power receiving/supplying portion for receiving/supplying a power, the power receiving/supplying portion being bonded to the solid-state element such that an element mounting surface thereof is nearly flush with a mounting surface of the solid-state element; and an inorganic sealing portion for sealing the solid-state element formed of an inorganic sealing material and a thermal expansion coefficient equal to that of the power receiving/supplying portion. The inorganic sealing portion defines an air layer between the solid-state element and the power receiving/supplying portion.

34 Claims, 17 Drawing Sheets

SOLID-STATE ELEMENT DEVICE

The present application is based on Japanese patent applications Nos. 2005-259845 and 2006-212630, the entire contents of which are incorporated herein by reference.

BACKGROUND OF THE INVENTION

1. Field of the Invention

This invention relates to a solid-state element device comprising a solid-state element sealed by a glass material and, in particular, to a solid-state element device that can prevent the separation of its electrode due to a thermal stress, and can offer good light extraction efficiency and excellent freedom in forming the electrode.

2. Description of the Related Art

Conventionally, a light emitting device is known in which a light emitting diode element (herein called "LED element") is flip chip-mounted on a substrate or a lead.

Recently, the light emitting device using the LED element as a light source is excellent in environment compatibility and safety, and therefore, its demand has increased. Especially, a high-brightness and large-output type light emitting device is desired as a substitute for use of a white illumination. However, since the heat generation of the LED element increases as the output increases, the emission efficiency lowers to limit the improvement of brightness.

In order to prevent a reduction in reliability due to the heat generation of the LED element, JP-A-2003-218403 discloses a composite light emitting element that an Au bump electrode disposed on the LED element has a size of 30% or more the plane cross section area of the LED element and the LED element is mounted on a submount element.

The composite light emitting element disclosed in JP-A-2003-218403 can improve the heat radiation property by increasing the area of the bump electrode to the plane cross section area of the LED element, so that the brightness can be enhanced according to its increased current.

However, the composite light emitting element disclosed in JP-A-2003-218403 has the problem that, since the Au bump electrode has the increased area and it has a larger thermal expansion coefficient than the LED element or contact electrode, the separation of the LED element may occur when conducting a high-temperature processing such as glass sealing. Thus, the reliability must lower. Further, since current distribution to its light emitting layer is thereby rendered nonuniform, its emission pattern cannot be uniformed. Further, since light emitted from the LED element can be reflected on the bump electrode or submount element, its metal reflection absorption loss will increase to limit the improvement of light extraction efficiency. Further, since the separation occurs at a portion with a large current density, its fed current must be reduced.

SUMMARY OF THE INVENTION

It is an object of the invention to provide a solid-state element device that can prevent the separation of its electrode due to a thermal stress, and can offer good light extraction efficiency and excellent freedom in forming the electrode.

(1) According to one aspect of the invention, a solid-state element device comprises:

a solid-state element comprising a pad electrode smaller than a contact electrode, the solid-state element being flip-mounted;

a power receiving/supplying portion for receiving/supplying a power, the power receiving/supplying portion being bonded to the solid-state element such that an element mounting surface thereof is nearly flush with a mounting surface of the solid-state element; and an inorganic sealing portion for sealing the solid-state element comprising an inorganic sealing material and a thermal expansion coefficient equal to that of the power receiving/supplying portion, wherein the inorganic sealing portion defines an air layer between the solid-state element and the power receiving/supplying portion.

In the invention (1), the following modifications and changes can be made.

(i) The contact electrode has no contact with the inorganic sealing portion.

(ii) A distance between the mounting surface of the solid-state element and the element mounting surface of the substrate is not more than 15 μm.

(iii) The power receiving/supplying portion comprises a circuit pattern electrically connected to the solid-state element, and a protrusion portion for suppressing penetration of the inorganic sealing material between the power receiving/supplying portion and the solid-state element is formed in the circuit pattern.

(iv) The contact electrode comprises a thermal expansion coefficient equal to that of a growth substrate of the solid-state element.

(v) The contact electrode comprises a transparent conductive material.

(vi) The transparent conductive material comprises an oxide.

(vii) The transparent conductive material comprises indium tin oxide (ITO).

(viii) The solid-state element device further comprises: a small refractive index film which comprises a refractive index smaller than that of the inorganic sealing material and which is formed on a side of the power receiving/supplying portion of the contact electrode of the solid-state element.

(ix) The solid-state element comprises linearly formed first and second electrodes which are opposed to each other through a nearly rectangular-shaped light emitting region.

(x) The solid-state element comprises a first electrode provided at a center of a light emitting region provided nearly in rectangular shape, and a second electrode provided in a periphery of the light emitting region.

(xi) The inorganic sealing portion comprises a phosphor.

(2) According to another aspect of the invention, a solid-state element device comprises:

a solid-state element comprising a contact electrode corresponding to a light emitting region, and a pad electrode smaller than the contact electrode, the solid-state element being flip-mounted;

a power receiving/supplying portion for receiving/supplying a power, the power receiving/supplying portion being bonded to the solid-state element such that an element mounting surface thereof is nearly flush with a mounting surface of the solid-state element; and an inorganic sealing portion for sealing the solid-state element comprising an inorganic sealing material and a thermal expansion coefficient equal to that of the power receiving/supplying portion, wherein the inorganic sealing portion defines an empty space between the solid-state element and the power receiving/supplying portion.

In the invention (2), the following modifications and changes can be made.

(xii) The contact electrode has no contact with the inorganic sealing portion.

(xiii) A distance between the mounting surface of the solid-state element and the element mounting surface of the substrate is not greater than 15 μm.

(xiv) The power receiving/supplying portion comprises a circuit pattern electrically connected to the solid-state element, and a protrusion portion for suppressing penetration of the inorganic sealing material between the power receiving/supplying portion and the solid-state element is formed in the circuit pattern.

(xv) The contact electrode comprises a thermal expansion coefficient equal to that of a growth substrate of the solid-state element.

(xvi) The contact electrode comprises a transparent conductive material.

(xvii) The transparent conductive material comprises an oxide.

(xviii) The transparent conductive material comprises indium tin oxide (ITO).

(xix) The solid-state element device further comprises: a small refractive index film which comprises a refractive index smaller than that of the inorganic sealing material and which is formed on a side of the power receiving/supplying portion of the contact electrode of the solid-state element.

(xx) The solid-state element comprises linearly formed first and second electrodes which are opposed to each other through a nearly rectangular-shaped light emitting region.

(xxi) The solid-state element comprises a first electrode provided at a center of a light emitting region provided nearly in rectangular shape, and a second electrode provided in a periphery of the light emitting region.

(xxii) The inorganic sealing portion comprises a phosphor.

(3) According to another aspect of the invention, a solid-state element device comprises:

a solid-state element comprising a contact electrode, formed of a transparent conductive material, corresponding to a light emitting region, and a pad electrode smaller than the contact electrode, the solid-state element being flip-mounted;

a power receiving/supplying portion for receiving/supplying a power from/to the solid-state element;

an inorganic sealing portion for sealing the solid-state element comprising a thermal expansion coefficient equal to that of the power receiving/supplying portion; and a small refractive index film comprising a refractive index smaller than that of the inorganic sealing portion, the small refractive index film being formed on a side of the power receiving/supplying portion of the contact electrode of the solid-state element.

In the invention (3), the following modifications and changes can be made.

(xxiii) The solid-state element device further comprises: an empty space defined between the small refractive index film and the power receiving/supplying portion.

(xxiv) The small refractive index film comprises a dielectric layer.

(xxv) The dielectric layer comprises a material for scattering and reflecting a light emitted from the solid-state element.

(xxvi) The dielectric layer comprises an $SiO_2$ layer.

(xxvii) The transparent conductive material comprises an oxide.

(xxviii) The transparent conductive material comprises indium tin oxide (ITO).

(xxix) The solid-state element comprises linearly formed first and second electrodes which are opposed to each other through a nearly rectangular-shaped light emitting region.

(xxx) The solid-state element comprises a first electrode provided at a center of a light emitting region provided nearly in rectangular shape, and a second electrode provided in a periphery of the light emitting region.

(xxxi) The inorganic sealing portion comprises a phosphor.

Advantages of the Invention

A solid-state element device of the invention can prevent the separation of its electrode due to a thermal stress, and can offer good light extraction efficiency and excellent freedom in forming the electrode.

BRIEF DESCRIPTION OF THE DRAWINGS

The preferred embodiments according to the invention will be explained below referring to the drawings, wherein:

FIG. 3A shows the light behavior in a glass sealing structure of the first embodiment, and FIG. 3B shows the light behavior in a structure that a sealing material is filled between the LED element and the element mounting substrate;

DETAILED DESCRIPTION OF THE PREFERRED EMBODIMENTS

First Embodiment

Figure 1:
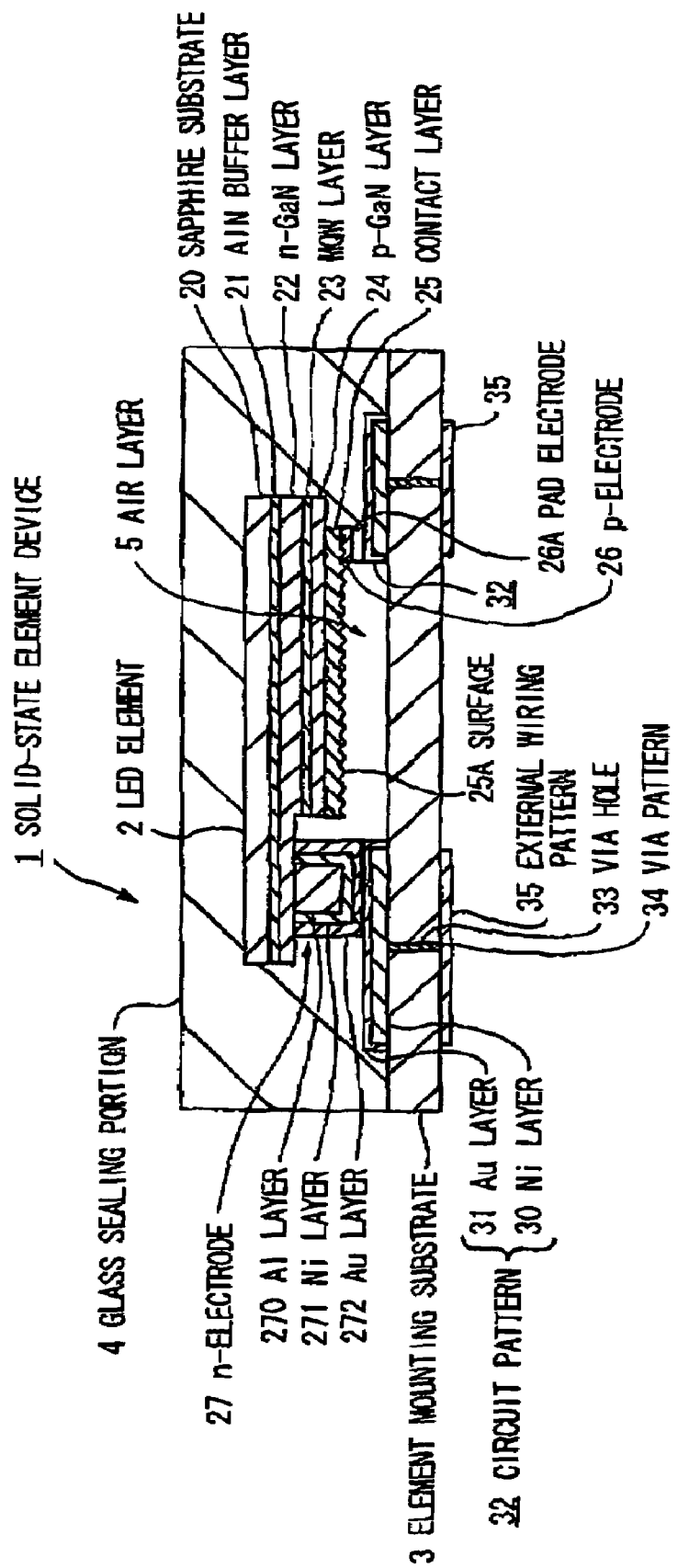
FIG. 1 is a cross sectional view showing a solid-state element device in a first preferred embodiment according to the invention.

FIG. 1 is a cross sectional view showing a solid-state element device 1 in the first preferred embodiment according to the invention.

Construction of Solid-state Element Device

The solid-state element device 1 comprises: a flip-chip type LED element 2, as a solid-state element, formed of a group III nitride-base compound semiconductor; an element mounting substrate 3 on which the LED element 2 is mounted and which comprises a power receive/supply portion to supply external power through a conductive portion to the LED element 2; and a glass sealing portion 4 that comprises an inorganic sealing portion to seal the element mounting substrate 3 with the LED element 2 mounted thereon. An air layer 5 (i.e., an empty space) is formed between the LED element 2 and the element mounting substrate 3. The air layer 5 (or gaseous layer) is formed in almost all regions except a bonding portion between the LED element 2 and the element mounting substrate 3. Gas contained in the air layer 5 can be arbitrary gas, e.g., air, nitrogen and argon.

The flip-chip type LED element 2 comprises the group III nitride-base compound semiconductor, and is operable to emit blue light with an emission wavelength of 460 to 470 nm. The LED element 2 is formed by, on a sapphire substrate 20 as an underlying substrate, sequentially growing an AlN buffer layer 21, an n-GaN layer 22, an MQW layer 23 and a p-GaN layer 24. On the p-GaN layer 24, a contact layer 25 of a p-electrode 26 is formed. On the contact layer 25, an Au pad electrode 26A of the p-electrode 26 is formed. Further, an n-electrode 27 is formed on an exposed part of the n-GaN layer 22 which is formed by removing the p-GaN layer 24 to the n-GaN layer 22 by etching. The n-electrode 27 comprises a contact layer and a pad layer formed on the same area. The LED element 2 of this embodiment is 340 µm square-sized and has a thermal expansion coefficient of $7 \times 10^{-6}$/° C. Meanwhile, in FIG. 1, the LED element 2 is shown with a different size than its real size so as to make clear the composition of the respective layers.

The MQW layer 23 is formed by laminating 6 pairs of an InGaN layer and AlGaN barrier layer alternately.

The contact layer 25 has a thermal expansion coefficient of $7 \times 10^{-6}$/° C. which is equal to that of the LED element 2, and formed of ITO (=indium tin oxide) with a refractive index of n=2.0. The contact layer 25 is roughened on the side of the air layer 5. Although the GaN layer of the LED element 2 has a thermal expansion coefficient of $5 \times 10^{-6}$/° C., the entire LED element 2 has the same thermal expansion coefficient as the sapphire substrate 20 since the sapphire substrate 20 with a thermal expansion coefficient of $7 \times 10^{-6}$/° C. makes up of a majority thereof.

The n-electrode 27 comprises an Al layer 270, a thin Ni layer 271 covering the Al layer 270, and an Au layer 272 covering the Ni layer 271.

The element mounting substrate 3 is formed of an $Al_2O_3$ polycrystalline sintered material, and has a thermal expansion coefficient of $7 \times 10^{-6}$/° C. which is equal to that of the LED element 2. on the surface of the element mounting substrate 3, a circuit pattern 32 is formed which comprises a Ni layer 30 patterned according to the electrode form of the LED element 2 and a thin Au layer 31 covering the surface of the Ni layer 30. The thicknesses of the Ni layer 30 and the Au layer 31 in the circuit pattern 32 are 8 µm. The circuit pattern 32 is electrically connected through a via pattern 34 formed in a via hole 33 to an external wiring pattern 35 formed on the bottom of the element mounting substrate 3. The element mounting substrate 3 may be formed of another material which has the same thermal expansion coefficient as $Al_2O_3$.

The glass sealing portion 4 is formed by hot-pressing a colorless and transparent ZnO-based glass as inorganic glass, and serves to seal the element mounting substrate 3 with the LED element 2 mounted thereon. In this embodiment, the glass sealing portion 4 is formed of a thermal melting glass which is 1.7 in refractive index, $6 \times 10^{-6}$/° C. in thermal expansion coefficient which is nearly equal to that of the element mounting substrate 3, and 480° C. in glass transition temperature (Tg). The thermal melting glass is a glass material to be molded by being melted or softened by heat, and is not a glass material (so-called sol-gel glass) to be molded by sol-gel method. In the sol-gel glass, it is difficult to form a thick glass film since the volume change in the molding is large to cause a crack therein. In contrast, the thermal melting glass can avoid this problem. Further, the sol-gel glass is less airtight since it is likely to generate pores. The thermal melting glass does not cause this problem and can effectively seal the LED element 2.

Figure 2A:
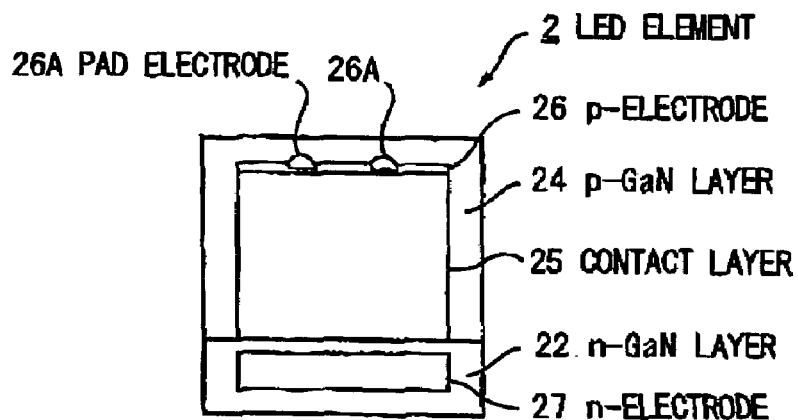
FIG. 2A is a bottom view showing an electrode forming surface of an LED element in FIG. 1.
Figure 2B:
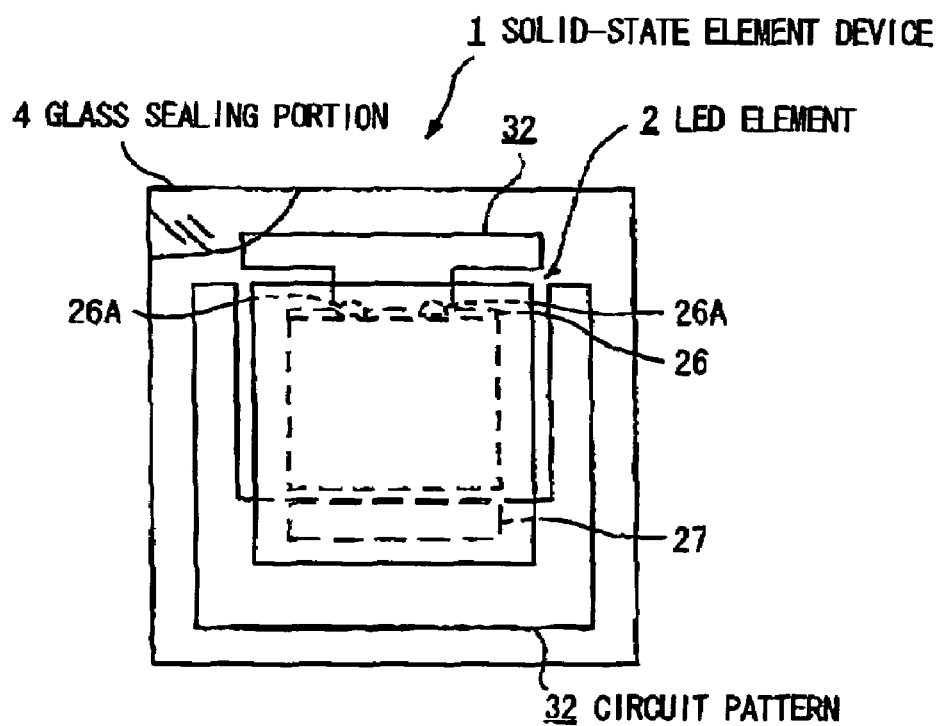
FIG. 2B is a top view showing the mounting state of the LED element in FIG. 1.

FIG. 2A is a bottom view showing the electrode forming surface of the LED element in FIG. 1. FIG. 2B is a top view showing the mounting state of the LED element in FIG. 1. Meanwhile, a part of the glass sealing portion in FIG. 2B is omitted for the sake of explanation.

As shown in FIG. 2A, the contact layer 25 of the p-electrode 26 is formed rectangular on the surface of the p-GaN layer 24. The 10 µm wide p-electrode 26 is formed along one side of the contact layer 25. The contact layer 25 is not in contact with the glass sealing portion between the LED element 2 and the element mounting substrate 3. The p-electrode 26 has the pad electrode 26A to be electrically bonded to the circuit pattern 32. The n-electrode 27 is formed rectangular while widely covering the surface of the exposed n-GaN layer 22. As shown in FIG. 2A, the p-electrode 26 and the n-electrode 27 are formed linear and opposed to each other through the rectangular emission region.

When the LED element 2 thus formed is flip-mounted with the electrode forming surface faced toward the substrate as shown in FIG. 2B, the pad electrode 26A is electrically face-bonded to the p-side circuit pattern 32 and the n-electrode 27 is electrically face-bonded to the n-side circuit pattern 32. In this case, no Au bump is used and a gap between the bottom of the mounted LED element 2 and the upper surface of the element mounting substrate 3 is rendered 10 µm or less.

Method of Making the Solid-state Element Device

A method of making the solid-state element device 1 of the first embodiment will be explained below. The element mounting substrate 3 used below is a wafer material on which the circuit pattern 32, the via pattern 34 and the external wiring pattern 35 are previously formed.

At first, the pad electrode 26A and the n-electrode 27 of the LED element 2 are positioned, to locate at predetermined positions, to the circuit pattern 32 on the element mounting substrate 3. Then, the LED element 2 is mounted on the element mounting substrate 3 by thermo compression combined with ultrasonic bonding. Then, the hot pressing is conducted to form the glass sealing portion 4 such that the ZnO glass is disposed on the LED element 2 in parallel to the element mounting substrate 3 and then they are compressed and bonded at 600° C. while disposing a pair of molds (not shown) both on the substrate side and on the glass side. The hot pressing is conducted in an atmosphere such as air, nitrogen and argon being inert to the respective materials, and its compression force is about 100 kg. Then, the element mounting substrate 3 with the glass sealing portion 4 integrated thereto is cut into a predetermined size by a dicer (not shown).

Behavior of Light Radiated to the Substrate Side from the LED Element

Figure 3A:
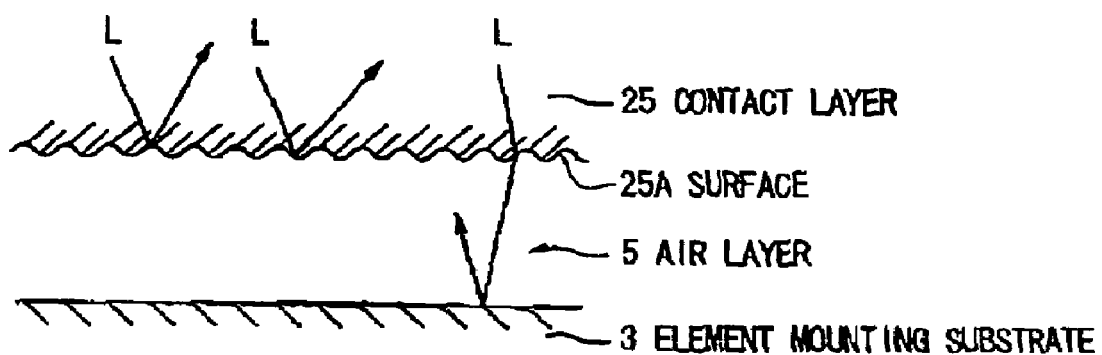
FIGS. 3A and 3B are diagrams showing behaviors of light emitted from the LED element toward its element mounting substrate, where
Figure 3B:
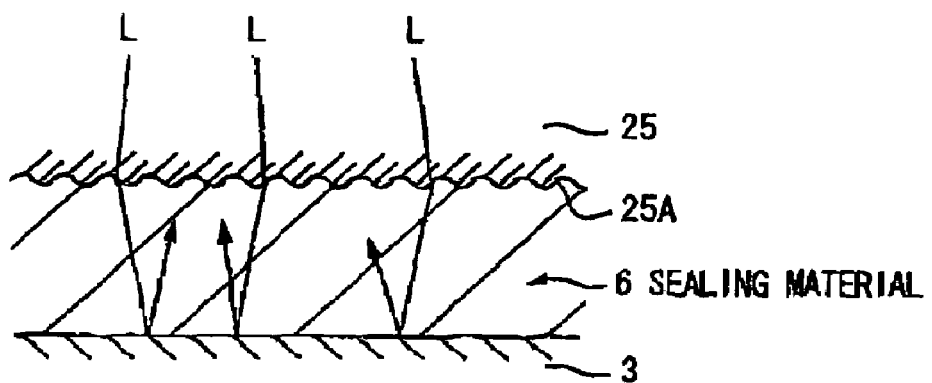

FIGS. 3A and 3B are diagrams showing behaviors of light emitted from the LED element toward its element mounting substrate. FIG. 3A shows the light behavior in the glass sealing structure of the first embodiment, i.e., having an empty space between the LED element 2 and the element mounting substrate 3. FIG. 3B shows the light behavior in the structure that a sealing material such as sealing resin and sealing glass is filled between the LED element and the element mounting substrate.

As shown in FIG. 3A, in the glass sealing structure of the first embodiment, the air layer 5 is formed between the p-electrode 26 and the n-electrode 27 when the glass with a high viscosity is hot-pressed and sealed. Due to the interface reflection between the contact layer 25 and the air layer 5, light reaching the element mounting substrate 3 is reduced. In this embodiment, in addition to the highly viscous glass, the LED element 2 is mounted on the element mounting substrate 3 such that the mounting surface of the LED element 2 is made nearly flush with, i.e., with a gap of 10 μm or less, the element-mounting surface of the element mounting substrate 3. Therefore, the glass material is less likely to enter into the gap between the LED element 2 and the element mounting substrate 3. The light reflected on the interface travels in a direction according to the roughened interface.

On the other hand, as shown in FIG. 3B, in the structure that the sealing material is filled between the contact layer 25 and the element mounting substrate 3, light is more likely to reach the surface of the element mounting substrate 3 due to the refractive index of the sealing material. For example, when using silicone with n=1.5 as the sealing material, optical loss occurs such that light reaching the circuit pattern 32 on the surface of the element mounting substrate 3 is subjected to reflection absorption loss, or light reaching a part except the circuit pattern 32 on the surface of the element mounting substrate 3 is subjected to leakage loss. For example, when ZnO-based glass with n=1.7 is used as the sealing material, light is inputted from the ITO (i.e., the contact layer 25) with n=2.0 to the glass with n=1.7 rather than the empty space with n=1.0, where the solid angles of critical angle and aperture angle are 58 degrees and 1.47 strad, respectively in case of the glass while they are 30 degrees and 0.42 strad, respectively in case of the empty space. Thus, the amount of light reaching the element mounting substrate 3 increases. If the light reaches the circuit pattern 32 with a reflectivity of about 40% relative to blue light, it will be subjected to reflection absorption loss. If the light reaches a part except the circuit pattern 32, it will be subjected to leakage loss on the bottom side due to the transparency of $Al_2O_3$.

Effects of the First Embodiment (1) Since the plate low-melting ZnO glass is disposed parallel to the element mounting substrate 3 and is then hot-pressed at a high viscosity, the process can be conducted at temperature sufficiently lower than the crystal growth temperature to enhance the sealing processability. Since the air layer 5 is formed between the LED element 2 and the element mounting substrate 3 when the low-melting glass is face-pressed in parallel to the surface of the element mounting substrate 3 to form the glass sealing portion 4, light reaching the interface between the contact layer 25 and the air layer 5 can be efficiently reflected based on the refractive index difference therebetween so that the reflection absorption loss caused when reaching the element mounting substrate 3 can be reduced.

If the flip mounting is conducted by general bump bonding with a diameter of 100 μm and a height of 25 μm or so, the low-melting glass may enter into a part of the contact layer 25 at the bottom of the LED element 2 even when being highly viscous by being compressed in the hot pressing although the empty space is formed. However, in this embodiment, since the mounting surface of the LED element 2 is rendered flush with the element mounting surface of the element mounting substrate 3 while omitting the bump bonding, the low-melting glass does not enter into a part of the contact layer 25 at the bottom of the LED element 2 when conducting the glass sealing so that the empty space can be wide formed.

(2) Since the ITO with a thermal expansion coefficient equal to that of the GaN-based semiconductor layer is used as the contact layer 25, the separation of the contact layer 25 from the GaN-based semiconductor layer is prevented so that stable emission characteristics can be obtained for long hours to enhance the reliability. Further, since a surface 25A of the ITO composing the contact layer 25 is roughened, the diffusion property of light reaching the interface between it and the air layer 5 can be improved to enhance the light extraction efficiency in the direction of the sapphire substrate 20 while preventing the amount of light outputted in the direction of the element mounting substrate 3.

(3) The mounting surface of the pad electrode 26A and the n-electrode 27 of the LED element 2 is rendered nearly flush with the circuit pattern 32 in the mounting state, and the glass sealing process is conducted at a high viscosity of $10^4$ poises or more. Therefore, the air layer 5 can be stably formed while preventing the penetration of the glass into the gap between the LED element 2 and the circuit pattern 32. In this embodiment, the mounting is conducted such that the mounting surface of the LED element 2 is rendered nearly flush with, i.e., with a gap of 10 μm or less, the circuit pattern 32 without using the Au stud bump.

(4) Since the contact layer 25 of the p-electrode 26 is provided with the small-sized pad electrode 26A, the light extractable area to the emission area can be increased to enhance the light extraction efficiency of light generated from the MQW layer 23. In this embodiment, along the edge of the contact layer 25 formed corresponding to the MQW layer 23 as the emission region of the LED element 2, the small-sized pad electrode 26A is linearly formed opposite to the n-electrode 27. Thereby, the uniform diffusion of current can be effected.

Further, the thermal expansion coefficients of the LED element 2, element mounting substrate 3 and glass sealing portion 4 are nearly equal to one another, and the thermal expansion coefficient of the glass sealing portion 4 is as low as $7 \times 10^{-6}$/° C. Further, the thermal stress is free at a high temperature during the glass sealing, and the LED element 2 is only subjected to small compressive stress at a room temperature. Therefore, the separation due to thermal expansion is unlikely to occur and, therefore, the increased bonding strength of the LED element 2 in the resin sealing is not always required. Thus, the bonding reliability can be secured even when the mounting surface of the LED element 2 is closely contacted to the element mounting surface of the element mounting substrate 3 without using the Au stud bump, the pad electrode 26A is downsized, or the p-electrode 26 is formed with the thin line.

(5) The glass sealing portion 4 is chemically bonded through an oxide to the element mounting substrate 3, and a large sealing strength can be obtained thereby. Thus, even when a small package with small bonding area is used, the glass sealing can be secured.

(6) Since the glass sealing portion 4 has the same thermal expansion coefficient as the element mounting substrate 3, the internal stress is kept low even when it is cooled to room temperature or lower after bonding at high temperature. Therefore, the bonding failure such as separation and cracking is unlikely to occur. In addition, the glass has the characteristics that it is likely to generate a crack in tensile stress and unlikely to generate any crack in compressive stress. For example, when the bonding test is conducted in combinations of glasses and ceramic substrates with various thermal expansion coefficients, it is confirmed that no crack is generated when the ratio of thermal expansion coefficient of a low-thermal expansion coefficient material relative to that of a high-thermal expansion coefficient material is 0.85 or more. Thus, "same thermal expansion coefficient" means that the ratio of thermal expansion coefficients thereof falls in this range although depending on the rigidity or size of the material.

(7) Since the LED element 2 is flip-mounted, the problems of the glass sealing can be overcome and, furthermore, the ultra-small solid-state element device 1 can be realized to be 0.5 mm square-sized. This is because the wire bonding space is unnecessary, the materials with the same thermal expansion coefficient are selected such as the glass sealing portion 4 and the element mounting substrate 3, and the interface separation is prevented by the strong adherence based on the chemical bonding even in case of bonding in the very small space.

(8) Since the circuit pattern 32 on the element mounting substrate 3 is drawn to the back side thereof by the via hole 33, no special measure is needed to prevent the penetration of the glass into unnecessary place or to prevent the electrical terminal from being covered with the glass. Therefore, the manufacturing process can be simplified. Further, since the plate low-melting glass can be used to integrally seal the plural devices, the solid-state element devices 1 can be easy mass-produced by dicer-cutting. Further, since the low-melting glass is processed at a high viscosity, no measure as required in case of resin is needed. Thus, the mass production can be sufficiently performed without using the via hole 33 if the external terminal is drawn externally.

Although in the first embodiment the glass sealing portion 4 is colorless and transparent, it may be formed of a colored transparent glass material. Alternatively, in order to compose the wavelength conversion type solid-state element device 1, the glass sealing portion 4 may be formed of a phosphor-containing glass which is prepared by mixing a sintered phosphor and a powder glass material and melting them, or a phosphor layer-containing glass material which is prepared by screen-printing on a transparent glass a mixture of a power glass material, a phosphor and a binder, disposing a transparent glass thereon, and heating them. For example, by using Ce:YAG as the phosphor, the solid-state element device 1 can be obtained which radiates white light based on the complementary color relationship of blue light and yellow light. Alternatively, the wavelength conversion type solid-state element device 1 can be composed by using another phosphor to be excited by blue light emitted from the LED element 2.

The material of the contact layer 25 is not limited to the ITO and can be another conductive oxide material such as $In_2O_3$—$SnO_2$ (90-10 wt %) and AZO [ZnO:Al]-IZO [$In_2O_3$—ZnO] (90-10 wt %) to obtain the same effect.

The contact layer 25 may be an Rh electrode. The Rh electrode has an effect to prevent the electrode separation although it does not have any effect to prevent the optical loss on the element mounting substrate 3 since it is not transparent. Rh has a thermal expansion coefficient of $8 \times 10^{-6}/°$ C., which is nearly equal to that of the ITO. However, it is known by electrode separation tests with tape that the Rh electrode has a lower bonding strength than the ITO electrode. Also, the Rh electrode is likely to be separated due to the thermal expansion/contraction of the Au pad electrode. To overcome this, the Au pad electrode can be formed only on the bonding part to the element mounting substrate 3 not on the entire Rh electrode so as to reduce the thermal stress thereof. Further, the element mounting substrate 3 can be rendered to have the same thermal expansion coefficient as the LED element 2 to reduce the thermal stress from the element mounting substrate 3. In addition, the stress applied from the glass to the electrode can be removed by preventing the glass from contacting the Rh electrode. By these measures, the electrode separation can be effectively prevented. In case of the ITO electrode, no electrode separation is observed even when the element mounting substrate 3 has a thermal expansion coefficient of 1.8 times that of the LED element 2 or the glass contacts the ITO electrode. However, in case of the Rh electrode, it is observed by sample tests that the incidence rate of separation is influenced thereby.

On the other hand, a thin Au—Co electrode formed of an Au—Co film with such a thickness (e.g., 200 nm) that light can pass therethrough has a thermal expansion coefficient of about two times that of the LED element 2. In this case, the electrode separation is not observed when the glass does not contact the Au—Co electrode. However, when a gap having a size of about 30 μm is defined between the mounting surface of the LED element 2 and the element mounting substrate 3 through the normal Au bump bonding, and thus the glass penetrates from an end portion of the Au—Co electrode by about 50 μm to contact the Au—Co electrode, the separation in a portion into which no glass penetrates did not occur in all the samples. Hence, the separation in a portion into which the glass penetrated was confirmed in all the samples. In other words, if no glass contacts the contact electrode, it is possible to remove the stress applied from the glass to the contact electrode. Thus, even when a thermal expansion coefficient ratio of the LED element to the contact electrode is large, the separation of the contact electrode can be prevented. On the other hand, when the LED element is equal in thermal expansion coefficient to the contact electrode, the separation of the contact electrode can be more stably prevented, and the higher reliability can be obtained.

Second Embodiment

Figure 4A:
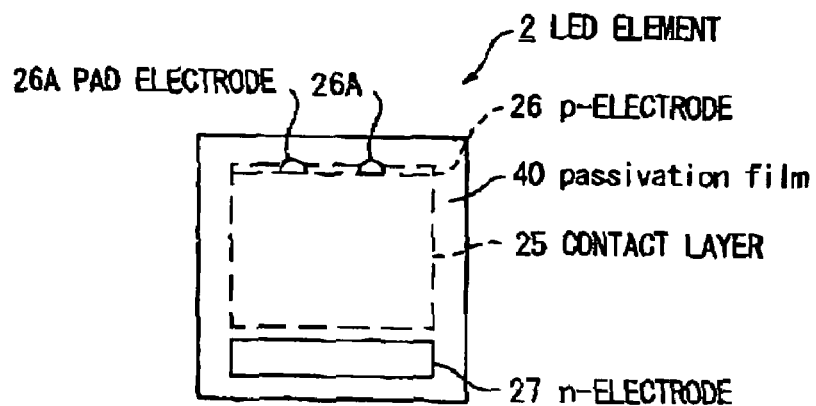
FIG. 4A is a bottom view showing an electrode forming surface of an LED element in a solid-state element device in a second preferred embodiment according to the invention.
Figure 4B:
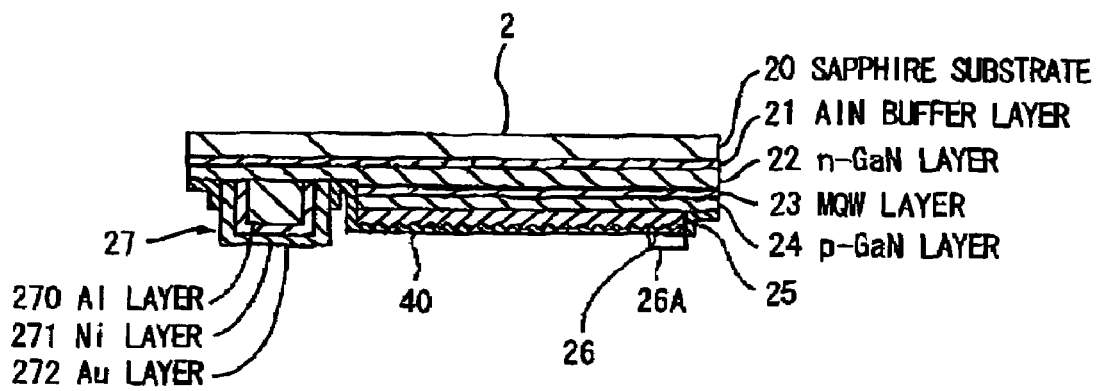
FIG. 4B is a cross sectional view showing the LED element in FIG. 4A.

FIG. 4A is a bottom view showing an electrode forming surface of an LED element in a solid-state element device in a second embodiment according to the invention, and FIG. 4B is a cross sectional view showing the LED element in FIG. 4A. Here, in the following description, constituent elements having the same or similar functions to those of the first embodiment are designated with the same referenced numerals, respectively.

Construction of LED Element

An LED element 2 has the same electrode structure as that described in the LED element 2 of the first embodiment. The LED element 2 has an element size of 250 μm square, and a passivation film 40 made of $SiO_2$ (refractive index n=1.4) are provided on the surface of a contact layer 25 and an n-GaN layer 22.

Effects of the Second Embodiment

According to the above-mentioned second embodiment, in addition to the desirable effects of the first embodiment, the following effects are offered. That is to say, even when the LED element 2 is miniaturized in size, the light emitting region is prevented from being remarkably reduced. In addition, since a rate of the contact layer 25 can be widely ensured for the element size, the current density can be unified and thus the LED element 2 having the less unevenness light emission can be obtained. The provision of the passivation film 40 results in that the emission of the light to the element mounting substrate 3 side can be suppressed by the interface reflection due to the refractive index difference between ITO and $SiO_2$, and the interface reflection due to the refractive index difference between $SiO_2$ and the air layer (not shown) as the gas layer. Here, in the glass sealing type LED element 2, it is unnecessary to take measures to cope wit the corrosion of the LED element 2 due to the moisture. Thus, the passivation film 40 is mainly provided for the optical purpose. Here, the $SiO_2$ layer of the optical film is not limited to the transparent film, and thus may be a polycrystallized white scattering reflection film. In addition, the material for the optical film is not limited to $SiO_2$, and thus may also be any other suitable dielectric material. Here, since the metal not only has the large thermal expansion coefficient, but also has the large light absorption due to the multiple reflections from the film formed on the irregular surface because of the high regular reflectivity, it is not suitable for the optical film.

Third Embodiment

Figure 5:
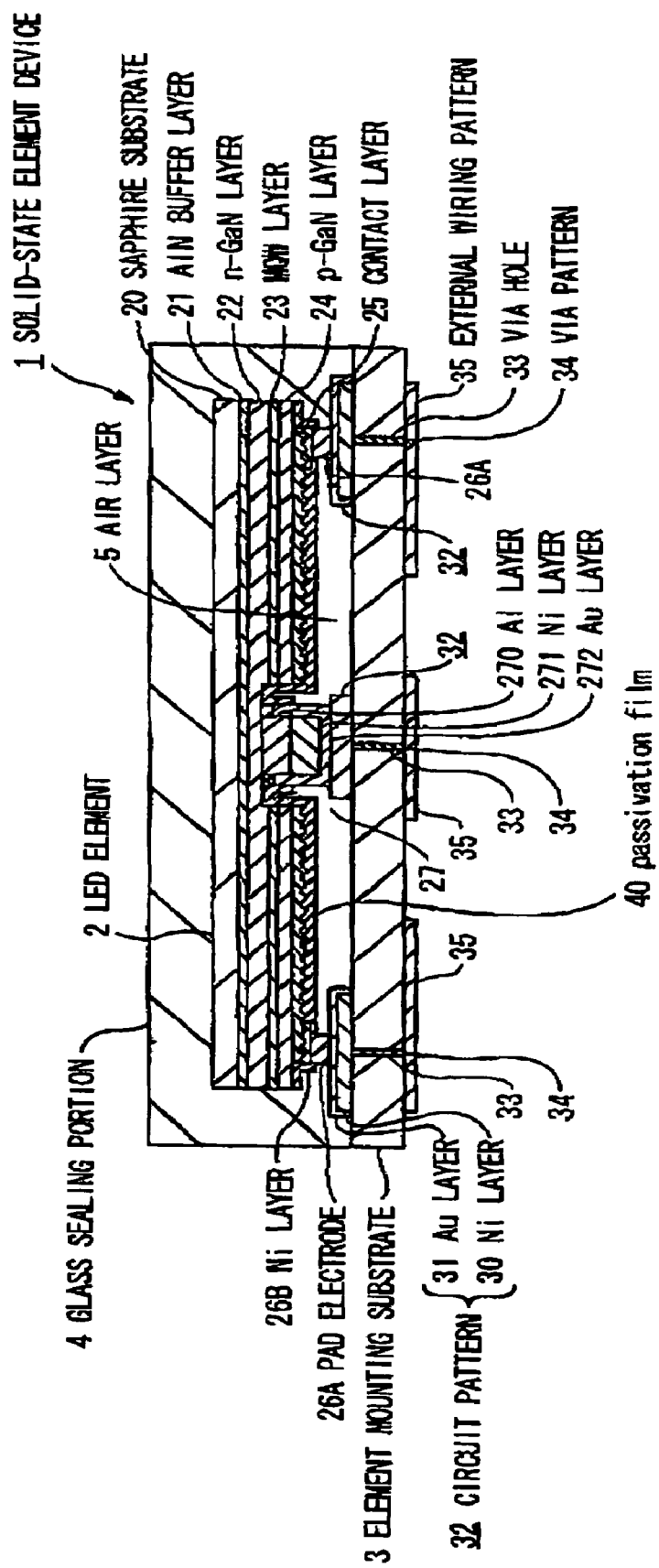
FIG. 5 is a bottom view showing an LED element in a solid-state element device in a third preferred embodiment according to the invention.
Figure 6:
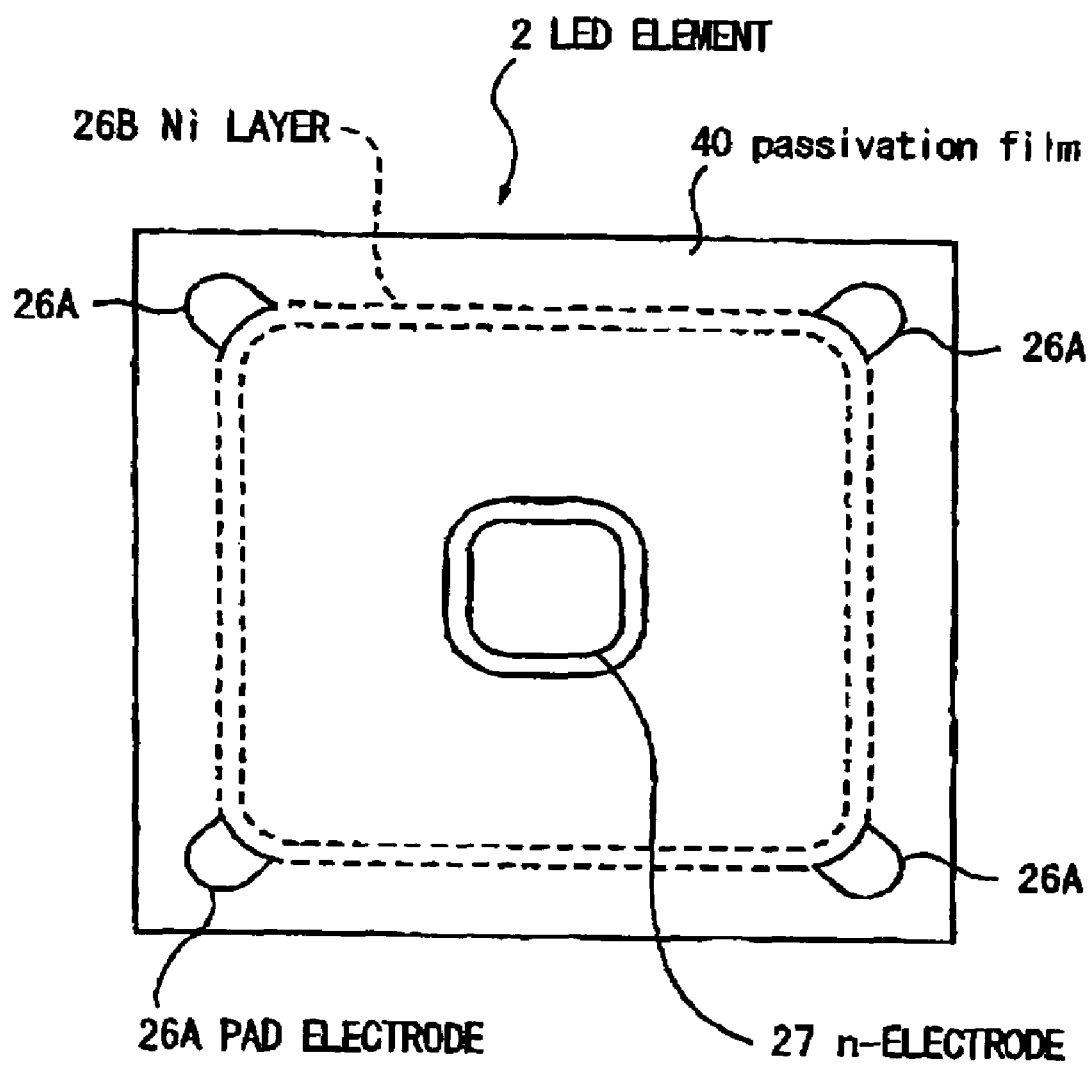
FIG. 6 is a cross sectional view showing the solid-state element device of the third embodiment.

FIG. 5 is a cross sectional view of a solid-state element device in a third embodiment according to the invention, and FIG. 6 is a bottom view showing an electrode forming surface of an LED element mounted to the solid-state element device of the third embodiment.

Construction of LED Element

In the solid-state element device 1, the LED element 2 having the contact layer 25 coated with the passivation film 40 described in the second embodiment is sealed with the glass. The n-electrode 27 is provided at a central portion of the LED element 2. In addition, each of the pad electrodes 26A which are electrically connected to the contact layer 25 through the Ni layer 26B is provided in small size outside the light emitting area.

As shown in FIG. 6, the pad electrodes 26A are disposed in the vicinities of corners of the LED element 2 and parts thereof are exposed from the passivation film 40. In addition, the n-electrode 27 disposed at the center of the LED element 2 is formed so as to form a joining surface having the same height as that of each of the pad electrodes 26A disposed in the periphery of the LED element 2.

Effects of the Third Embodiment

According to the above-mentioned third embodiment, in addition to the desirable effects of the second embodiment, the following effects are offered. That is to say, the disposition of the n-electrode 27 at the central portion of the LED element 2 results in that the distance between the p-electrode and the n-electrode can be shortened in the LED elements having the same size as compared with the first and second embodiments. Or, even in the case of the LED element 2 having the doubled similar ratio, the equal distance can be obtained between the p-electrode and the n-electrode in this case. Hence, it is possible to suppress the resistance loss in the epitaxial layer when the large current is caused to flow. In addition, although the heat accompanying the light emission is generated on the n-electrode 27 side, the heat dispersion can be unified and the heat radiating property can be enhanced. For this reason, the circuit pattern 32 to which the n-electrode 7 is connected is preferably formed in suitable size corresponding to the heat radiating property.

Figure 7:
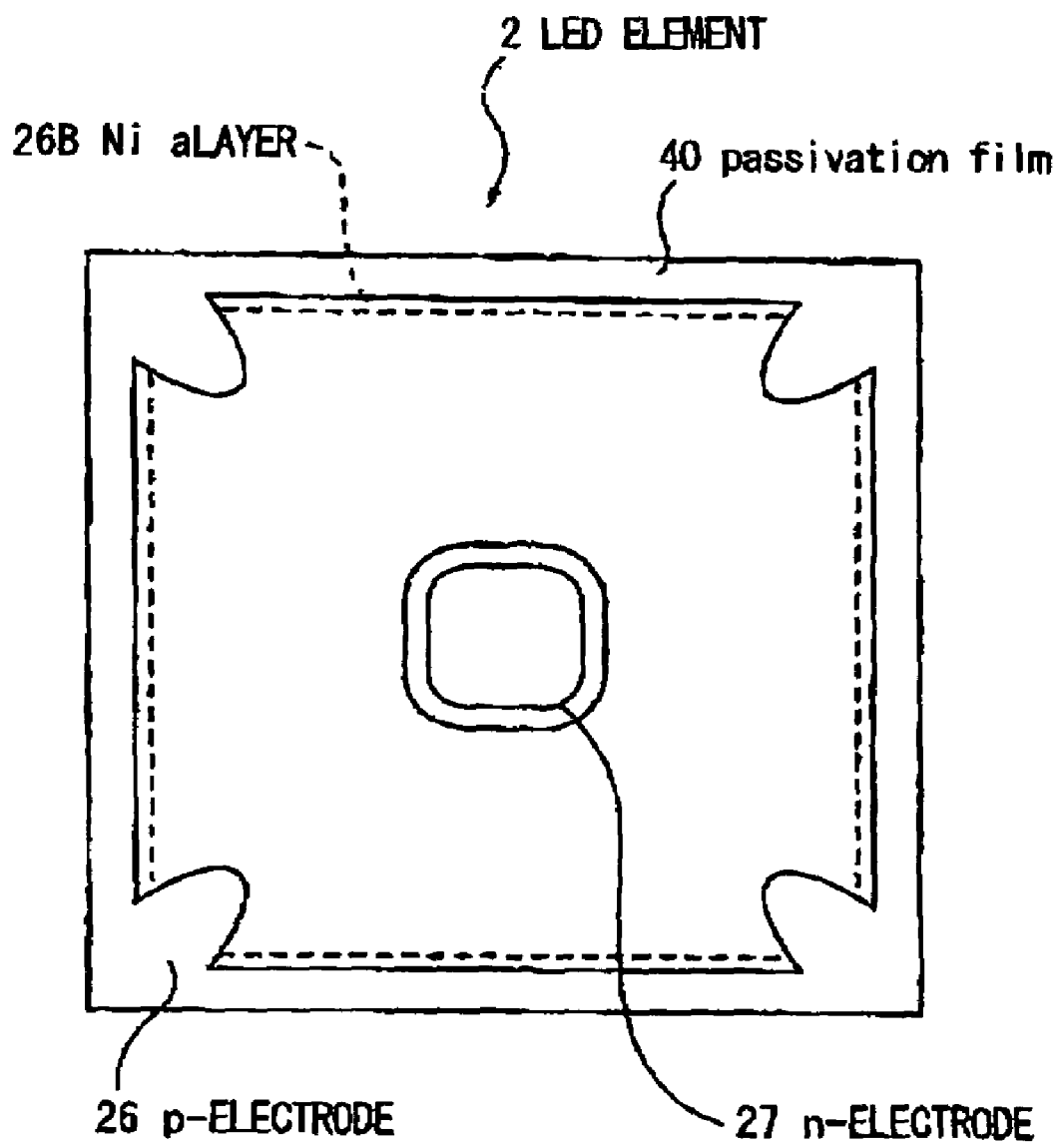
FIG. 7 is a bottom view showing a modification of the LED element of the third embodiment.

Note that, there may be adopted a construction that as shown in FIG. 7, a p-electrode 26 is continuously formed along the periphery so as to impede the light emitting area instead of providing the pad electrodes 26A.

Fourth Embodiment

Figure 8:
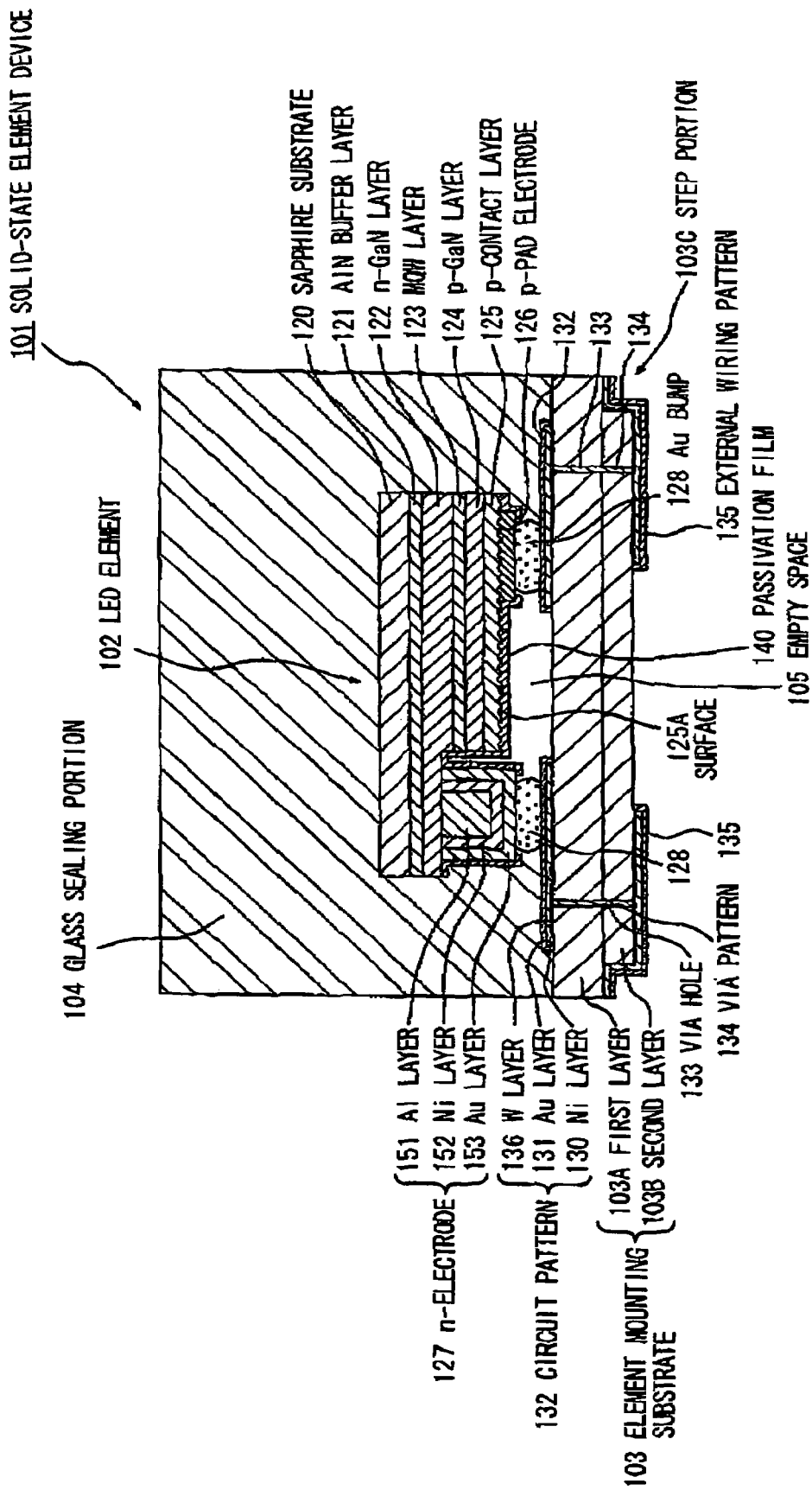
FIG. 8 is a cross sectional view showing a solid-state element device in a fourth preferred embodiment according to the invention.

FIG. 8 is a cross sectional view showing a solid-state element device in a fourth embodiment according to the invention.

Construction of Solid-State Element Device

The solid-state element device 101 comprises an LED element 102 as a flip chip type solid-state element having a group III nitride system compound semiconductor, an element mounting substrate 103 as a power receiving/supplying portion for mounting thereon the LED element 102, and supplying a power supplied from the outside to the LED element 102 through a conductive portion, and a glass sealing portion made of an inorganic sealing material for sealing the element mounting substrate 103 having the LED element 102 mounted thereon. Also, an empty space 105 is defined between the LED element 102 and the element mounting substrate 103. The empty space 105 is defined nearly in the overall region except for the joining portion between the LED element 102 and the element mounting substrate 103.

The LED element 102 comprises a flip chip type group III nitride system compound semiconductor, and emits a blue light having an emission wavelength of 460 nm. In this embodiment, the LED element 102 is formed in 46 μm square, and has a thermal expansion coefficient of $7\times10^{-6}/°C$.

The LED element 102 is formed by depositing successively an AlN buffer layer 121, an n-GaN layer 122, an MQW layer 123 and a p-GaN layer 124 on a sapphire substrate 120 as a growth substrate. The MQW layer 123 corresponding to the light emitting region is formed by depositing alternately an InGaN layer and an AlGaN barrier layer by six pairs. Here, the number of pairs for the MQW layer 123 may be arbitrarily set. Note that, in FIG. 8, the portions are shown in sizes different from their exact sizes for the sake of clarifying the structure of the individual layers.

The LED element 102 has a contact electrode 125 which is made of an indium tin oxide (ITO) and which is formed on the p-GaN layer 124 on its mounting surface. A p-pad electrode 126 made of Ni—Au is formed on a part of the contact electrode 125. An n-electrode 127 is provided in an exposed portion of the n-GaN layer 122 which is formed by subjecting layers from the p-GaN layer 124 to the n-GaN layer 122 to the etching processing. The contact layer and the pad layer are formed in the same area of the n-electrode 127.

The contact electrode 125 has the thermal expansion coefficient of $7\times10^{-6}/°C$. nearly equal to that of the LED element 102, and is made of ITO having a refractive index of n=2.0. Although the contact electrode 125 is preferably formed by utilizing the sputtering method from a viewpoint of an adhesion strength, it may be formed by utilizing the EB evaporation method. An element mounting substrate 103 side of the contact electrode 125 is formed in the form of a roughened surface. In addition, the n-electrode 127 comprises an Al layer 151, a thin Ni layer 152 covering the Al layer 151, and an Au layer 153 covering the surface of the Ni layer 152. Au bumps 129 are formed on a p-pad electrode 126 and an n-electrode 127, respectively. Each of the Au bumps 128 is 90 μm in diameter and 20 μm in height.

In addition, the LED element 102 has a passivation film 140, as an optical film, which covers exposed portions, on the element mounting substrate 103 side, of the contact electrode 125 and the n-GaN layer 122. In this embodiment, the passivation film 140 covers outer edge portions as well of the p-pad electrode 126 and the n-electrode 127 continuously with the contact electrode 125 and the n-GaN layer 122. The passivation film 140 is formed of an $SiO_2$ (refractive index=1.4) layer as a dielectric layer, and has a thickness of 0.3 μm. That is to say, a small refractive index medium including the empty space 105 and the dielectric layer is disposed between the contact electrode 125 of the LED element 102 and the element mounting substrate 103.

The element mounting substrate 103 is a multilayer substrate made of a polycrystalline sintered material of $Al_2O_3$, and has the thermal expansion coefficient of $7 \times 10^{-6}/°$ C. nearly equal to that of the LED element 102. Here, the element mounting substrate 103 may also be made of any other material as long as this material has the thermal expansion coefficient nearly equal to that of the LED element 102. Specifically, the element mounting substrate 103 is constructed by laminating a first layer 103A on the mounting surface side and a second layer 103B on a side opposite to the mounting surface side. The second layer 103B is formed to be smaller than the first layer 103A when viewed from a plane, and a step portion 103C of the first layer 103A and the second layer 103B is provided in the outer edge of the element mounting substrate 103. Here, the first layer 103A is 0.15 mm in thickness and the second layer 103B is 0.1 mm in thickness. Also, the element mounting substrate 103 is 0.25 mm in thickness.

In addition, a circuit pattern 132 comprises a W layer 136, a thin Ni layer 130 covering the surface of the W layer 136, and a thin Au layer 131 covering the surface of the Ni layer 130. Also, the circuit pattern 132 is formed as a pattern in correspondence to the electrode shape of the LED element 102 is formed on the element mounting surface of the element mounting substrate 103. An external wiring pattern 135 comprises a W layer 136, a thin Ni layer 130 covering the surface of the W layer 136, and a thin Au layer 131 covering the surface of the Ni layer 130. Also, the external wiring pattern 135 is formed as a pattern in correspondence to shapes of terminals for connection to the outside on the surface of the element mounting substrate 103 opposite to the mounting surface thereof. The circuit pattern 132 and the external wiring pattern 135 are electrically connected to each other through a via pattern 134, made of W, which is provided in a via hole 133 completely extending in a thickness direction through the element mounting substrate 103. The external wiring pattern 135 is formed to the step portion 103C described above.

The glass sealing portion 104 seals the element mounting substrate 103 having the LED element 102 mounted thereon by subjecting a transparent and colorless ZnO system glass as the inorganic sealing material. In this embodiment, the glass sealing portion 104 is made of a thermal welding glass which is the refractive index of 1.7, has the thermal expansion coefficient of $6 \times 10^{-6}/°$ C. slightly lower than that of the element mounting substrate 103, and has the glass transition point (Tg) of 480° C. Here, the thermal welding glass is a glass which is obtained through the forming in a melting state or in a softening state by the heating, and thus is different from a glass which is obtained through the forming by utilizing a sol-gel method. Cracks are readily generated in the sol-gel glass since a large change in volume in the phase of the firming occurs in the sol-gel glass, which results in that it is difficult to form the thick sol-gel glass. However, this problem can be avoided in the thermal welding glass. In addition, since pores are readily generated in the sol-gel glass, the air-tightness is impaired in some cases. However, this problem is not caused in the thermal welding glass, and thus the LED element 102 can be exactly sealed with the thermal welding glass. Specifically, the glass sealing portion 104 is made of a $ZnO$—$B_2O_3$—$SiO_2$—$Nb_2O_5$—$Na_2O$—$Li_2O$ system low-melting point glass and is formed in rectangular parallelpiped shape. A side face of the glass sealing portion 104 is formed by cutting a plate glass bonded to the element mounting substrate 103 through the hot pressing processing together with the element mounting substrate 103 by using a dicer.

Figure 9:
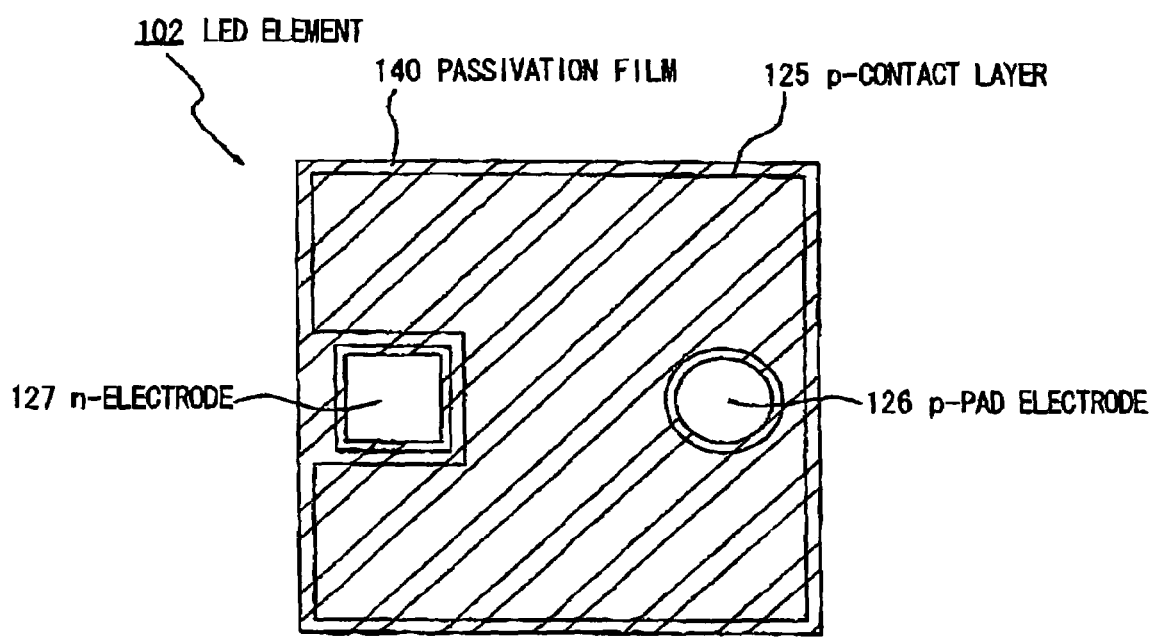
FIG. 9 is a bottom view showing an LED element in the fourth embodiment, where its Au bumps are omitted.
Figure 10:
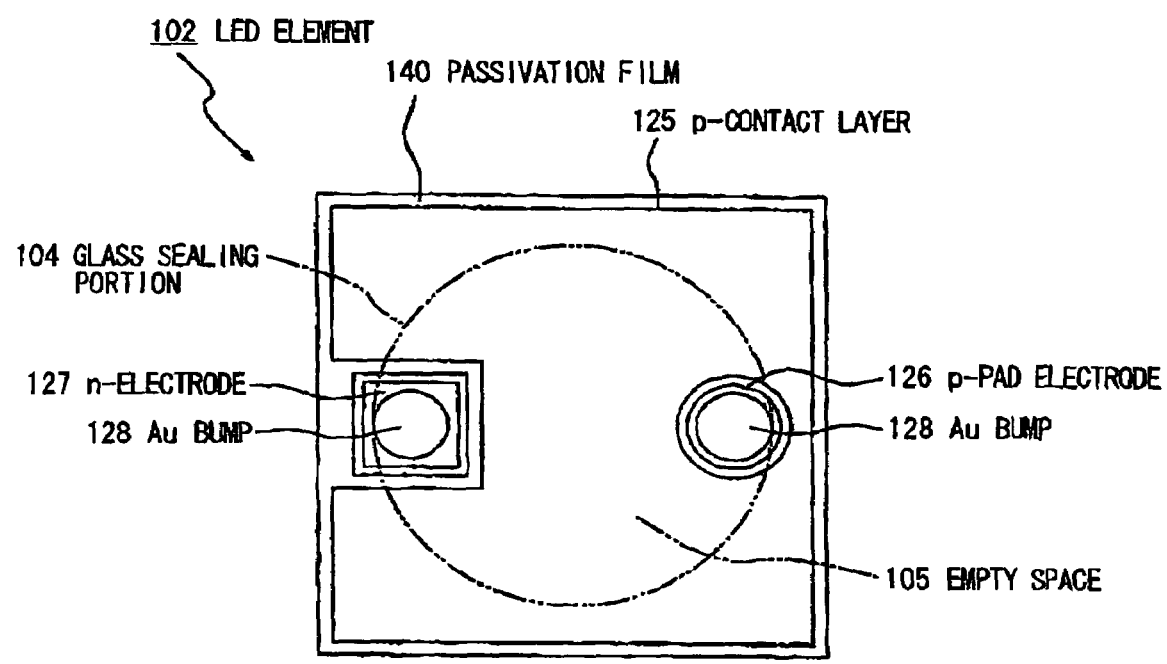
FIG. 10 is a bottom view showing the LED element in FIG. 9, where the formation of its glass sealing portion when the LED element is mounted on the element mounting substrate is illustrated.

FIG. 9 is a bottom view showing an LED element in the fourth embodiment, where it Au bumps are omitted, and FIG. 10 is a bottom view showing the LED element in FIG. 9, where the formation of its glass sealing portion when the LED element is mounted on the element mounting substrate is illustrated.

As shown in FIG. 9, the p-pad electrode 126 shows a round shape when viewed from a plane, and the n-electrode 127 shows a square when viewed from a plane. The n-electrode 127 is disposed on the opposite side of the p-pad electrode 126. The p-contact electrode 125, as shown in FIG. 9, is formed so as to cover the surface of the p-GaN layer 124. Then, the electrode forming surface of the LED element 102 is coated with the passivation film 140 except for the center side of the p-pad electrode 126 and the n-electrode 127 when viewed from a plane.

The LED element 102 thus constructed, as shown in FIG. 8, is flip-mounted with the electrode forming surface being directed to the substrate side, which results in that the p-pad electrode 126 is electrically connected to the p-circuit pattern 132 through the corresponding Au bump 128 and the n-electrode 127 is electrically connected to the n-circuit pattern 132 through the corresponding Au bump 128.

Method of Making the Solid-State Element Device

A method of making the solid-state element device 101 of the fourth embodiment will be explained below. A wafer-shaped substrate which is made by sintering a green sheet for the first layer 103A and the second layer 103B, and in which the circuit pattern 132, the via pattern 134, and the external wiring pattern 135 are formed on the sintered body is used as the element mounting substrate 103.

Then, a plurality of LED elements 102 are positioned with respect to the circuit pattern 132 on the element mounting substrate 103 so that the p-pad electrode 126 and the n-electrode 127 are disposed in predetermined positions, respectively. Next, the LED elements 102 are mounted on the element mounting substrate 103 by utilizing a thermosonic bonding method.

After that, the plate-shaped $ZnO$—$B_2O_3$—$SiO_2$—$Nb_2O_5$—$Na_2O$—$Li_2O$ system glass is disposed on each of the LED elements 102 so as to be parallel to the element mounting substrate 103. In this state, a pair of molds (not shown) is set on the element mounting substrate 103 and on the glass side, respectively, and the hot pressing processing is performed through the thermocompression while the heating is performed at 600° C. Thus, the glass is thermocompression-bonded to the element mounting substrate 103, thereby forming the glass sealing portion 104. Here, the hot pressing processing is performed in nitrogen ambient, and a pressing force is about 100 kg.

At this time, the height of the Au bump 128 of the LED element 102 is 20 μm, and thus as shown in FIG. 10, the glass comes into a space defined between the LED element 102 and the element mounting substrate 103. However, since the viscosity of the glass is relatively large, the empty space 105 is left between the p-pad electrode 126 and the n-electrode 127 in a vertical section. In this embodiment, as shown in FIG. 10, the empty space 105 is formed nearly in round-shape when viewed from a plane. Next, the element mounting substrate 103 with which the glass sealing portion 104 is integrated is cut into pieces each having a predetermined size by using the dicer (not shown).

Effects of the Fourth Embodiment

According to the above-mentioned fourth embodiment, the following effects are obtained.

Since a rate of the contact electrode 125 can be widely ensured for the size of the LED element 102 in the solid-state element device 101 thus constructed, the current density can be unified and thus the LED element 102 having the less uneven light emission can be obtained. In addition, the provision of the passivation film 140 results in that the emission of the light to the element mounting substrate 103 side can be suppressed by the interface reflection due to the refractive index difference between ITO and $SiO_2$ similarly to the second embodiment. As shown in FIG. 10, the glass of the glass sealing portion 104 comes into the space defined between the passivation film 140 and the element mounting substrate 103 on the outer edge side of the LED element 102. However, even in the state in which the glass of the glass sealing portion 104 comes thereinto, it is possible to obtain the interface reflection function due to the refractive index difference between ITO and $SiO_2$. Moreover, in the center side of the LED element 102, the emission of the light to the element mounting substrate 103 can be suppressed not only by the interface reflection due to the refractive index difference between ITO and $SiO_2$, but also by the interface reflection due to the refractive index difference between $SiO_2$ and the gas.

In addition, the passivation film 140 made of $SiO_2$ functions as an insulating member when the Au bump 128 on the n-electrode 127 is crushed in the glass sealing process, in which the pressure operates in the high temperature state, to squeeze out to the p-contact electrode 125.

Moreover, the contact electrode 125 made of ITO has the thermal expansion coefficient nearly equal to that of the main body portion of the LED element 102 and also has the large adhesion strength. Hence, even when the boundary of the coming-into of the glass exists in the contact electrode 125, no contact electrode 125 is separated during the glass sealing processing. In addition, it is confirmed that no contact electrode 125 is separated even when a liquid phase thermal shock test is performed between −40° C. and 100° C. for the samples of the solid-state element devices of this embodiment by 2,000 cycles. In addition, it is also confirmed that there is no change in optical output and driving voltage even in the test under the condition in which an optical output is 50 mW, a temperature is 100° C., and a current is 100 mA for 10,000 hours.

On the other hand, the following two states are confirmed in a light emitting element using an Au—Co thin film electrode and an Rh—Au electrode as the contact electrode. As for one of them, it is confirmed that although the portion into which the glass comes is satisfactory, the electrode joining becomes insufficient in a portion in which the gas layer is formed, and thus when the light emitting element is turned on, the emission luminance in a certain portion of the gas layer is remarkably reduced or no light emission is obtained. As for the other of them, it is confirmed that the electrode is separated and thus the abnormal light emission is observed irrespective of the portion into which the glass comes, and the portion in which the gas layer is formed.

Note that, it is confirmed that although when an $Al_2O_3$ substrate (thermal expansion coefficient=$12 \times 10^{-6}$/° C.) containing therein a glass and a phosphoric acid system glass (thermal expansion coefficient=$12 \times 10^{-6}$/° C.) are used, the degree of the phenomenon of separation of the contact electrode becomes large in the above-mentioned Au—Co thin film electrode and Rh—Au electrode, no nonconformity occurs when the contact electrode 125 made of ITO is used. However, in order to obtain the stable quality, a thermal expansion coefficient ratio of the element mounting substrate to the light emitting element is desirably set in the range of 50 to 150%.

In this embodiment, in the element mounting substrate 103 made of $Al_2O_3$, the step portion 103C is provided in order to increase the joining strength of the solder when the solid-state element device 101 is mounted by using the solder, and the external wiring pattern 135 formed in the step portion 103C is used as the terminals for connection to the outside. For this reason, although the multilayer substrate is used, the reflectivity of the substrate made of $Al_2O_3$ is reduced since a light absorption component is contained in the element mounting substrate 3 due to the substrate joining. In addition, since the surface of the circuit pattern 132 on the element mounting surface of the element mounting substrate 103 has the Au layer 131, its reflectivity for the light having the wavelength of 460 nm is about 40%. For this reason, the emission of the light to the element mounting substrate 103 is desirably suppressed.

In addition, the plate-shaped $ZnO$—$B_2O_3$—$SiO_2$—$Nb_2O_5$—$Na_2O$—$Li_2O$ system glass as the low-melting point glass is set so as to be parallel to the element mounting substrate 103, and is subjected to the hot pressing processing in the high viscosity state, which results in that the processing at a temperature sufficiently lower than the crystal growth temperature becomes possible, and the sealing processing property is enhanced. In addition, when the low-melting point glass makes a parallel movement to the surface of the element mounting substrate 103 to adhere closely thereto to form the glass sealing portion 104, the empty space 105 is defined between the element mounting substrate 103 and the LED element 102. As a result, the operation for reflecting the light reaching the interface between the empty space 105 and the passivation film 140 based on the refractive index difference between the passivation film 140 and the empty space 105 becomes large, and it is possible to reduce the reflection/absorption loss due to the fact that the light reaches the element mounting substrate 103.

Further, the ITO with thermal expansion coefficient on the same order as that of the sapphire substrate 120 of the LED element 102 used as the contact electrode 125, allows exhibiting stable light emission over a long period of time without causing separation of the contact electrode 125 and GaN-based semiconductor layer due to thermal stress caused by heat and light emission during glass sealing, and having excellent reliability. The roughened surface 125A of the ITO, which constitutes the contact electrode 125, allows exhibiting good scattering of light that reaches the interface between it and the passivation film 140, and ensuring enhancement in light extraction to the sapphire substrate 120 side while restricting emission to the element-mounted substrate 103 side.

Still further, because the p-side pad electrode 126 and the n-side pad electrode 127 of the LED element 102 are mounted to the circuit pattern 132 with the Au bump 128, and because the glass sealing is performed in a high viscosity condition above $10^4$ poise, glass can be prevented from entering between the LED element 102 and the circuit pattern 132, which allows ensuring stable formation of the hollow portion 105.

Still further, the LED element 102, the element-mounted substrate 103, and the glass sealing portion 104 have thermal expansion coefficient on the same order, and the thermal expansion coefficient of the glass sealing portion 104 is as small as $7\times10^{-6}/°$ C. Further, a stress-free state occurs at high temperatures for glass sealing, and a small compression stress acts on the LED element 102 at normal temperature. Thus, because of the structure with a small incidence of separation due to thermal expansion, the junction strength of the LED element 102 required in resin sealing is not necessarily required, which allows enhancement of reliability in the vicinity of the p-side pad electrode 126.

Still further, bonding the element-mounted substrate 103 and the glass sealing portion 104 based on chemical bonding via the oxide allows firm bonding strength. This allows materialization of glass sealing even for a small-sized package with small junction area.

Still further, because the element-mounted substrate 103 and the glass sealing portion 104 have thermal expansion coefficient on the same order, and internal stress after high temperature bonding is therefore small even at normal or low temperatures, the incidence of bonding failure such as separation, cracking, etc. is small. In addition, glass has a high incidence of cracking for tension stress, and a low incidence of cracking for compression stress. Also, the experiment of the bonding property with various thermal expansion coefficient combinations for both glass and ceramic substrates, verified that bonding is possible without cracking at 0.85 or more thermal expansion coefficient ratios of the low to high thermal expansion coefficient member. The thermal expansion coefficient on the same order refers to being in such a range, although depending on members' rigidity, size, etc.

Still further, flip-mounting the LED element 102 has the effect of being able to overcome the problem with materialization of glass sealing, and materialize a 0.5 mm square ultra-small solid state element device 101. This is because wire bonding space is unnecessary, and because the element-mounted substrate 103 and the glass sealing portion 104 have thermal expansion coefficient on the same order, and because the firm bonding based on chemical bonding allows no interface separation even in small space bonding.

Still further, because the circuit pattern 132 of the element-mounted substrate 103 is drawn to the backside at the via-hole 133, glass can be prevented from entering unnecessary portion, or covering electrical terminals, which allows simplifying the manufacturing process. Also, because plural devices can be collectively sealed with a thermal fusion glass sheet, it is possible to easily mass-produce plural solid state element devices 101 by dicing. Because the thermal fusion glass is fabricated in a high viscosity condition, unlike resin, if the external terminal is drawn to the backside, sufficient mass-production is possible without depending on the via-hole 133.

Although in the fourth embodiment, the glass sealing portion 104 has been explained as comprising colorless transparent glass, it may be colored transparent glass. Also, the solid state element devices 101 may be of a wavelength conversion type that has the glass sealing portion 104 formed using fluorescent-substance-containing glass formed by mixing and fusing a sintered fluorescent substance and powder glass, or glass with a fluorescent substance layer provided by mixing powder glass and a fluorescent substance with a binder and screen-printing on a transparent glass sheet, followed by superimposing thereon another transparent glass and subsequent heat treatment. For example, by using Ce:YAG as the fluorescent substance, it is possible to obtain the solid state element device 101 that radiates white light based on complimentary colors of blue and yellow light. Also, the solid state element devices 101 may be of a wavelength conversion type using another fluorescent substance that can be excited by blue light radiated from the LED element 102.

Also, the contact electrode 125 material is not limited to the ITO, but may use a light-transmissible conductive oxide, such as $In_2O_3$—$SnO_2$ (90-10 wt %), AZO [ZnO:Al]-IZO [$In_2O_3$—ZnO] (90-10 wt %), InGaN, etc. Also, the refractive index of the light-transmissible conductive material is 1.7 or more from the point of view of light extraction from the light-emitting element. Also, because the light-transmissible conductive material with a thermal expansion coefficient of 200% relative to the light-emitting element tends to cause separation as in gold (Au), to prevent separation, the thermal expansion coefficient of the light-emitting element is desirably in the range of 50-150%. From this point of view, it is desired that the light-transmissible conductive material use the oxide. Here, the refractive index of the Au layer 131 in the surface of the circuit pattern 132 is 92% for 600 nm wavelength light, 82% for 550 nm, and 48% for 500 nm. There is the large effect of Au on absorption loss at wavelengths of 550 nm or less. To this end, this embodiment uses the LED element 102 that emits 550 nm or less light, and which is combined with the element-mounted substrate 103 with the surface of the circuit pattern 132 being the Au layer 131, therefore having the particular effect on the absorption loss reduction. The inventors verified that when glass sealing is performed at 30 μm height of the Au bump 128, and by applying 100 kg weight pressure to a 20 mm square glass, there occurs a gas layer with a diameter on the order of 100 μm.

Figure 11:
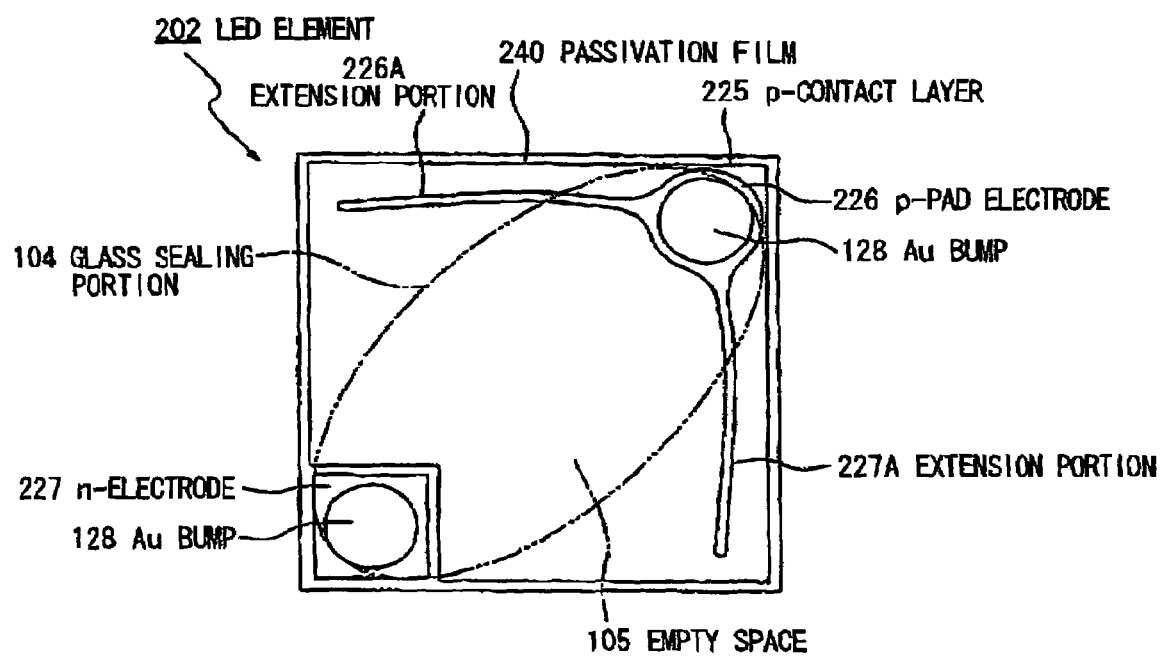
FIG. 11 is a bottom view showing a modification of the LED element of the fourth embodiment.

Also, although in the fourth embodiment, the p-side pad electrode 126 and the n-side pad electrode 127 are shown as opposite side arrangement, as shown in FIG. 11, a p-side pad electrode 226, which is circular in plan view, and an n-side pad electrode 227, which is square in plan view, may be arranged diagonally on an LED element 202. As shown in FIG. 11, this LED element 202 has a contact electrode 225 formed to cover the surface of a p-GaN layer, and a passivation film 240 formed as an optical film to cover the surface of the contact electrode 225 and of an n-GaN layer. Also, the p-side pad electrode 226 has a pair of extension portions 227A that extend substantially in parallel along a side of the bottom surface of the LED element 202. Further, hollow portion 105 formed in glass sealing portion 104 is in a diagonally elongated elliptical shape with respect to the p-side pad electrode 226 and the n-side pad electrode 227 at the bottom of the LED element 202.

Fifth Embodiment

Figure 12:
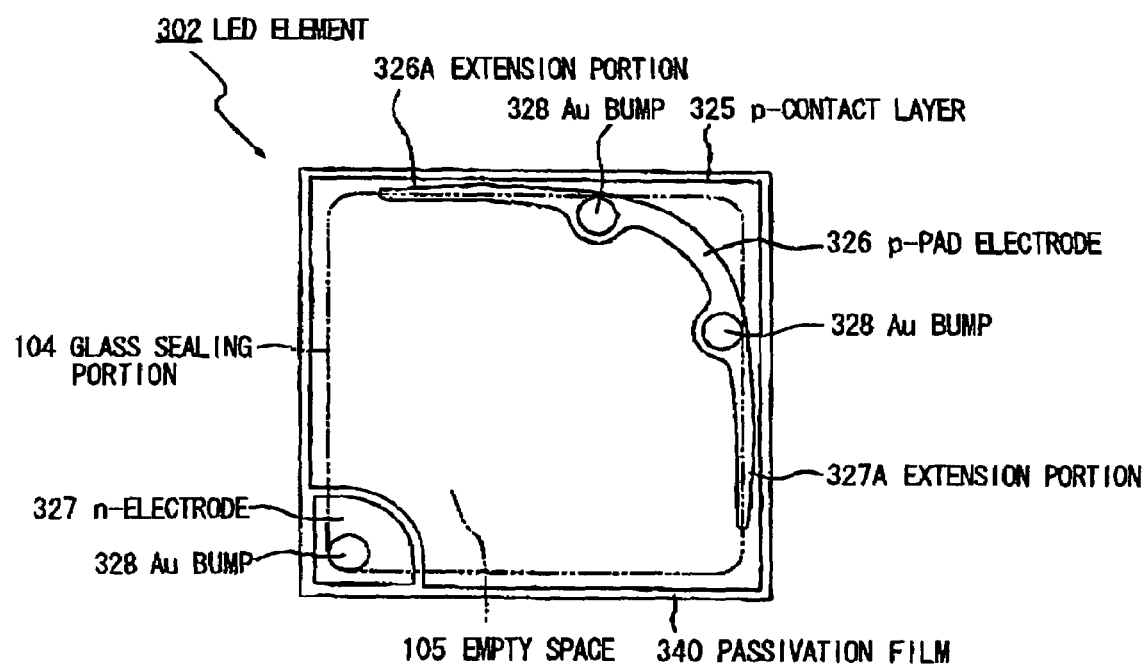
FIG. 12 is a bottom view showing an LED element in a fifth embodiment according to the invention, where the formation of its glass sealing portion when the LED element is mounted on the element mounting substrate is illustrated.

FIG. 12 shows the LED element in the fifth preferred embodiment according to the invention. In concrete, FIG. 12 is an explanatory diagram of a bottom view of the LED element showing a formation state of a glass sealing portion when mounted on an element mounting substrate in the fifth preferred embodiment.

Construction of LED Element 302

As shown in FIG. 12, a p-pad electrode 326 and a n-electrode 327 are disposed diagonally also in a LED element 302. As shown in FIG. 12, the LED element 302 is construed such that a p-contact layer 325 covers a surface of p-GaN layer and a passivation film 340 covers a surface of the p-contact layer 325 and a surface of the n-GaN layer.

The p-pad electrode 326 is extended with curvature such that the p-pad electrode 326 is concaved in respect to a center of the bottom surface of the LED element 302. In this preferred embodiment, two Au bumps 328 are formed on the p-pad electrode 326, and a bump formation part in the p-pad electrode 326 is greater in width than the other parts. The respective Au bumps 328 are disposed symmetrically in respect to a diagonal line of the bottom surface of the LED element 302. Each of the Au bumps 328 has a diameter of 40 μm and a height of 15 μm, and is formed by using an Au wire having a diameter of 20 μm. According to this structure, a distance between a mounting surface of the LED element 302 and an element mounting surface of the element mounting substrate is 15 μm or less, as a result, the surfaces are substantially the same plane. Further, the p-pad electrode 326 has a pair of extension portions 326A that are extending along and substantially parallel to one side of the bottom surface of the LED element 302.

The n-electrode 327 is formed to have a fan shape in which a center angle is a right angle and a chord is disposed along a corner of the LED element 302. One of the Au bumps 328 is formed on the n-electrode 327. The Au bumps 328 formed on the n-electrode 327 has an identical shape to another one of the Au bumps 328 formed on the p-pad electrode 326.

An empty space 105 formed on the glass sealing portion 104 shows a substantially square shape in plan view. In more concrete, the empty space 105 is formed of a part which is deviated from an outer periphery of the LED element 302 to the inside by 20 μm to 30 μm.

Effects of the Fifth Embodiment

According to the fifth preferred embodiment as described above, a formation region of a air layer 305 can be increased by virtue of using the Au bump 328 with a small diameter, so that it is possible to enhance an effect for suppressing the light reaching to the element mounting substrate.

In the fifth preferred embodiment, the bump bonding with the element mounting substrate is conducted at three points. However, a sufficient reliability will be obtained when using the two-points bump bonding, since the element mounting substrate 3, the glass sealing portion 104 and the LED element 302 have the same thermal expansion coefficient, a stress which peels the p-contact layer 325 will not occur against the LED element 302 after conducting the sealing process.

Sixth Embodiment

Figure 13:
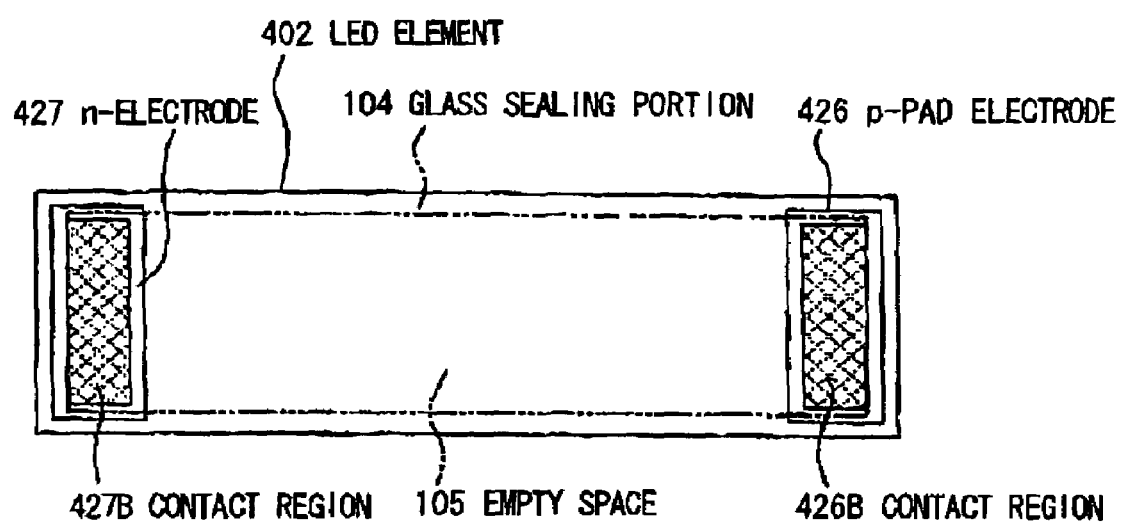
FIG. 13 is a bottom view showing an LED element in a sixth embodiment according to the invention.
Figure 14:
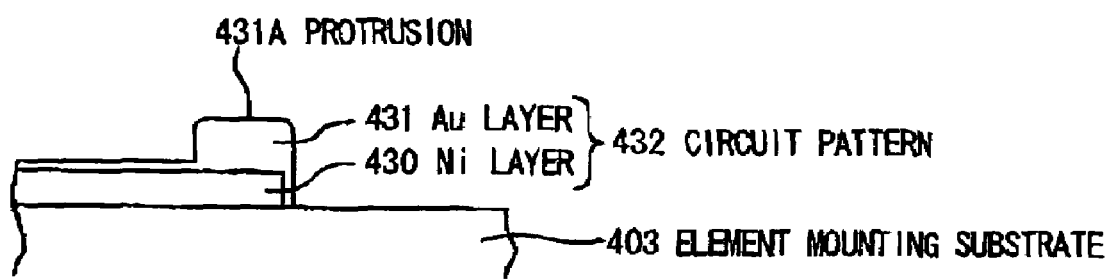
FIG. 14 is a partial cross sectional view showing an element mounting substrate in the sixth embodiment.

FIGS. 13 and 14 show the LED element in the sixth preferred embodiment respectively. FIG. 13 is a bottom view showing the LED element, and FIG. 14 is a partial vertical cross sectional view of the element mounting substrate.

Construction of LED Element 402

As shown in FIG. 13, a LED element 402 is formed to have a longitudinal rectangular shape in plan view. A p-pad electrode 426 and a n-electrode 427 are disposed on opposite sides along both short sides of the LED element 402. Namely, the p-pad electrode 426 an the n-electrode 427 are formed to be linear, and disposed oppositely via a substantially rectangular light emission region. Both the p-pad electrode 426 and the n-electrode 427 have a rectangular shape extending along the short sides of the LED element 402 in plan view.

Construction of Element Mounting Substrate 403

As shown in FIG. 14, a circuit pattern 432 is formed on a mounting surface of the element mounting substrate 403, the circuit pattern 432 comprises a Ni layer 430 patterned in accordance with a shape of the electrode of the LED element, and a thin film Au layer 431 which covers a surface of the Ni layer 430. On the Au layer 431, a protrusion 431A protruded to the LED element side compared with the other parts is formed. The protrusion 431A is formed so as to suppress the penetration of the glass into a gap between the element mounting substrate 403 and the LED element 402. In this preferred embodiment, the protrusion 431A has a protruding amount of 5 μm, and has a rectangular shape in plan view. Further, the protrusion 431A is contacted to a contact region 427B in a center portion of the p-pad electrode 426 (see FIG. 13). Also in the n-electrode 427, a protrusion 431A contacts to a contact region 427B in a center portion of the n-electrode 427. In this preferred embodiment, no Au bump is provided. As shown in FIG. 13, the empty space 105 of the glass sealing portion 104 is formed to have a rectangular shape in which the short sides are inscribed to the respective protrusions 431A.

Effects of the Sixth Embodiment

According to the sixth preferred embodiment as described above, the penetration of the glass into a gap between the LED element and the element mounting substrate 403 can be suppressed by the protrusion 431A.

Further, since the protrusion 431A is formed to have the rectangular shape, the protrusions 431A are face-contacted to the electrodes of the LED element, so that the LED element can be mounted by the two-points bonding with keeping a stable mounting state.

Still further, since the protrusion 431A is formed by using the Au layer 431 of the circuit pattern 432, it is not necessary to form the bump, so that a formation process of the bump can be omitted.

Figure 15:
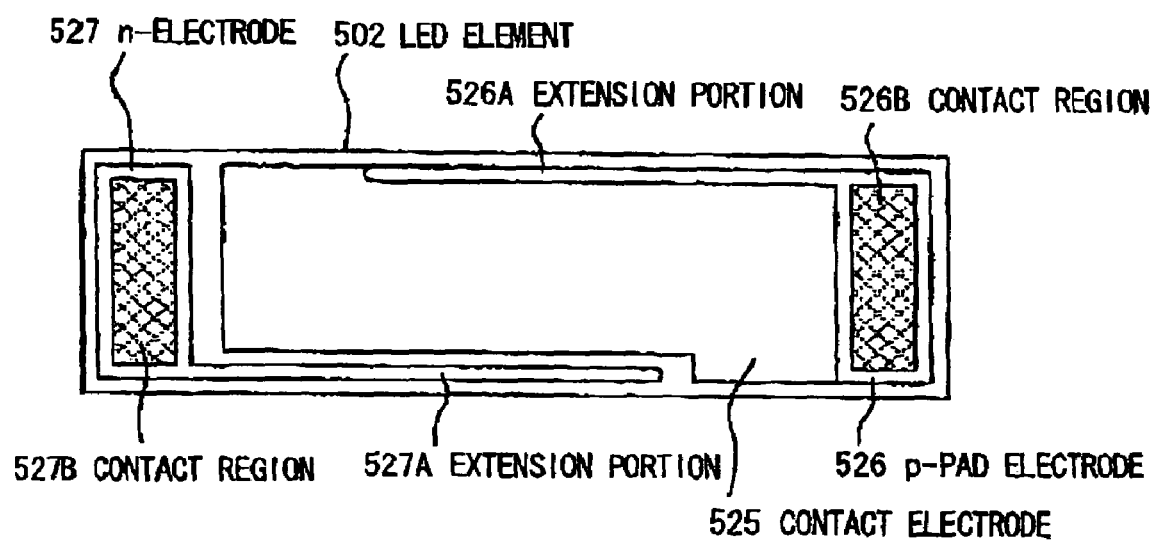
FIG. 15 is a bottom view showing a modification of the LED element of the sixth embodiment.

In the sixth preferred embodiment, the element mounting substrate 403 in which the circuit pattern 432 is formed to have the rectangular shape in plan view is shown. However, as shown in FIG. 15, for example, extension portions 526A, 527A extending along the long sides of the LED element 502 may be formed on the p-pad electrode 526 and the n-electrode 527 respectively. Namely, the p-pad electrode 526 and the n-electrode 527 are formed to be linear, and disposed oppositely via a substantially rectangular light emission region. Further, the extension portions 526A, 527A extending from linear edges are formed. Both the p-pad electrode 526 and the n-electrode 527 have a rectangular shape extending along the short sides of the LED element 502 in plan view. According to this structure, since each of the extension portions 526A, 526B function as a diffusion electrode, the current density can be further homogenized. The p-pad electrode 526 and the n-electrode 527 are formed to have a rectangular shape respectively, and the center parts thereof are provided as the contact regions 526B, 527B which are contacted to the protrusion 431A of the element mounting substrate 403. Herein, a contact electrode 525 of the LED element 402 is formed to avoid the extension portion 527A of the n-electrode 527 in plan view.

Seventh Embodiment

Figure 16:
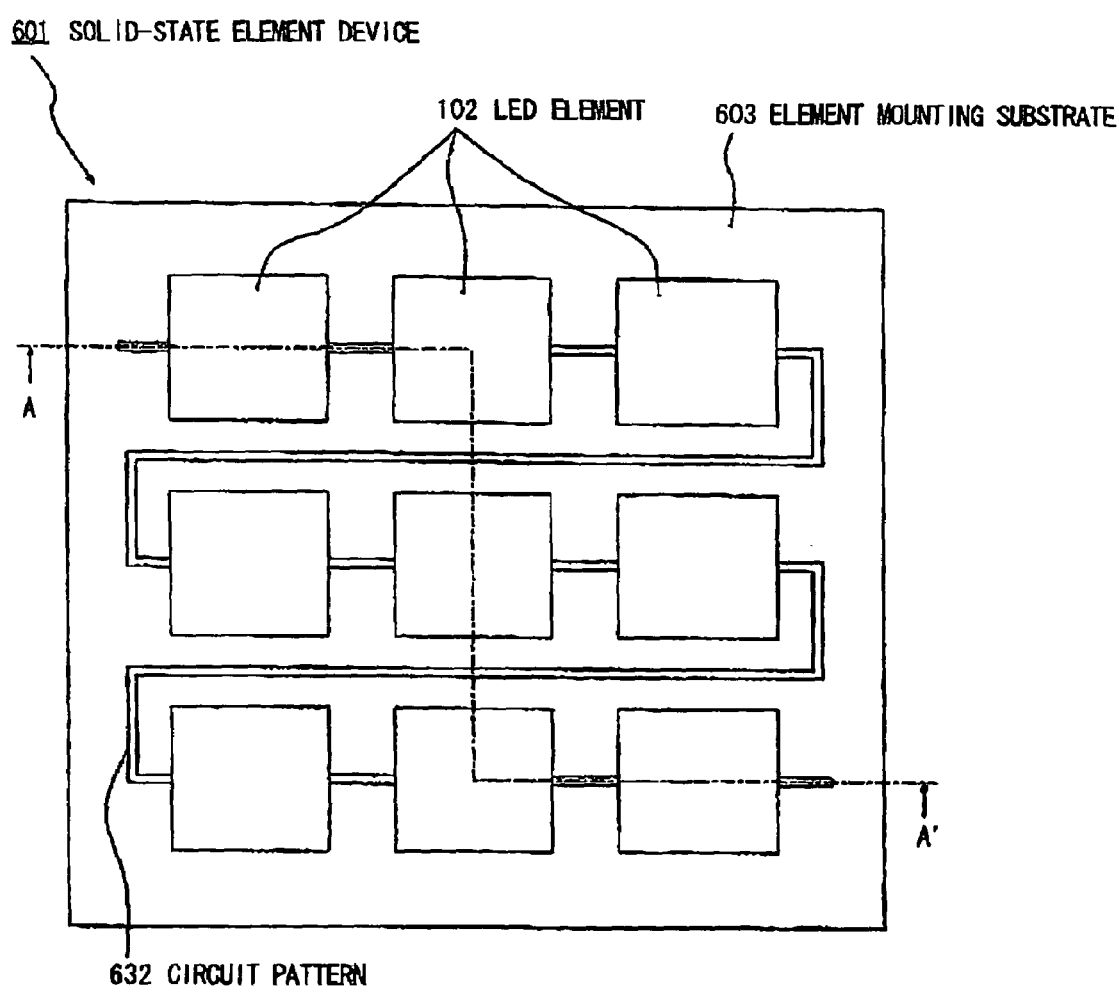
FIG. 16 is a top view showing a solid-state element device in a seventh preferred embodiment according to the invention.
Figure 17:
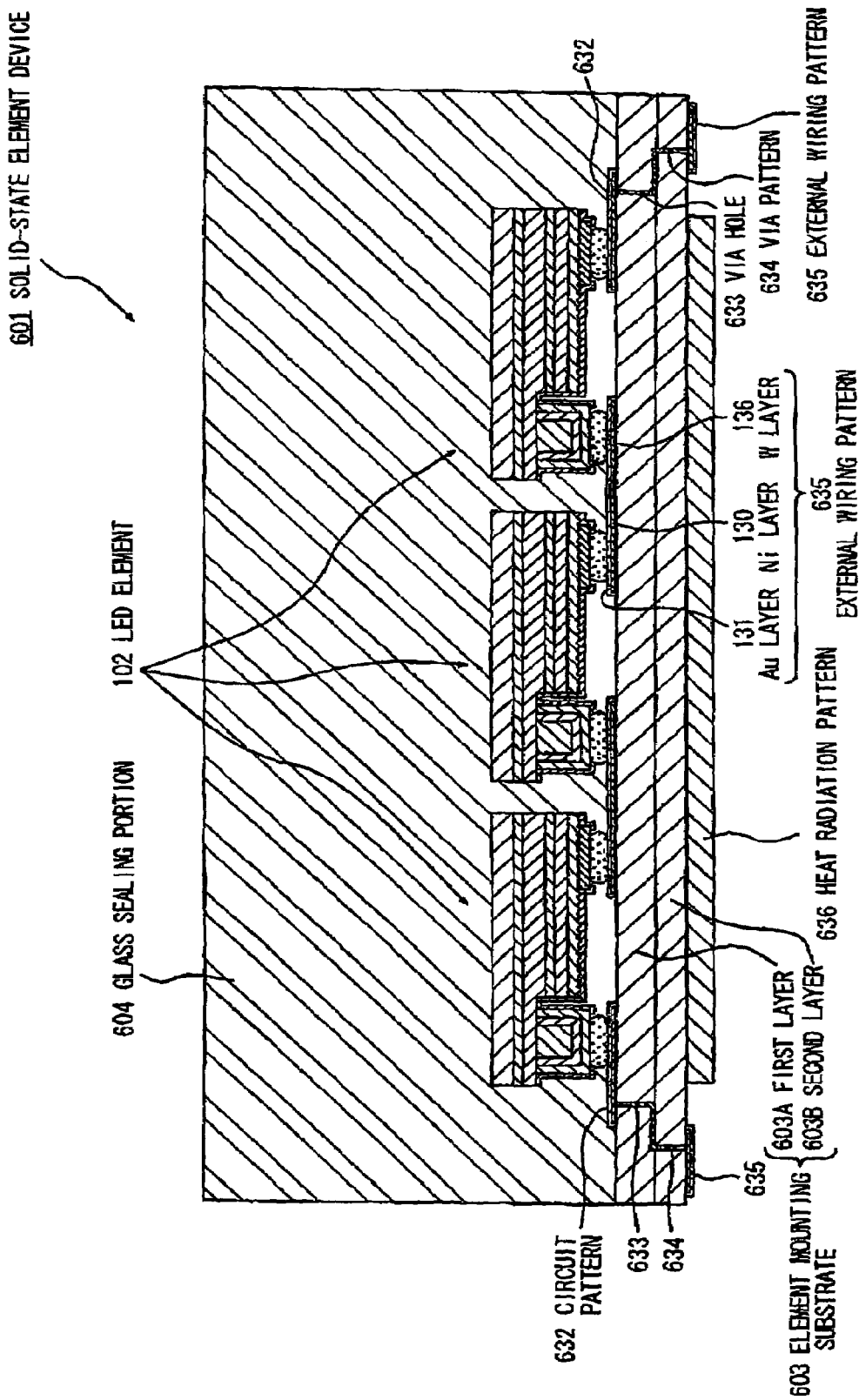
FIG. 17 is a cross sectional view cut along a line A-A' in FIG. 16.

FIGS. 16 and 17 show the LED element in the seventh preferred embodiment respectively. FIG. 16 is a top view of a solid-state element device, and FIG. 17 is a cross-sectional view of the solid-state element device shown in FIG. 16 cut along A-A line.

Construction of Solid-state Element Device 601

A solid-state element device 501 comprises a plurality of flip-chip type GaN-based LED elements 102, and a element mounting substrate 603 with a multilayered structure for mounting a plurality of the LED elements 102 which is formed to have a square shape in plan view. Further, the solid-state element device 601 comprises a circuit pattern 632, a via hole 633, a via pattern 634, and an external wiring pattern 635, each comprising a tungsten (W) layer 136, on both surfaces and in the respective layers of the element mounting substrate 603. Herein, a nickel (Ni)-plating and a gold (Au)-plating are further provided on the circuit pattern 632 and the external wiring pattern 635, respectively, to form a Ni layer 130 and an Au layer 131. Further, a heat radiation pattern 636 for radiating the heat generated in the LED elements 102 to the outside is formed on a surface opposing the mounting surface of the element mounting substrate 603. The heat radiation pattern 636 is formed by the same process as the forming process of the external wiring pattern 635, and comprises the W-layer 136. Further, the solid-state element device 601 has a glass sealing portion 604 composed of $B_2O_3$—$SiO_2$—$Li_2O$—$Na_2O$—$ZnO$—$Nb_2O_5$-based low-melting point glass, which seals the respective LED elements 102 and is adhered to the element mounting substrate 603.

The respective LED elements 102 are arranged in a matrix of 3×3 (column and row), and nine pieces of the LED elements 102 in total are mounted on the single element mounting substrate 603. The respective LED elements 102 are electrically connected in series by the circuit pattern 632. The external wiring patterns 635 are disposed at corners in vicinity of the LED elements 102 diagonally located (left upper position and right lower position in FIG. 16). The nine pieces of the LED elements 102 can emit the light by applying the voltage via the two external wiring patterns 635.

Effects of the Seventh Embodiment

According to the seventh preferred embodiment as described above, even if a plurality of the LED elements 102 are densely mounted, since the LED elements 102 and the glass sealing portion 604 have the same thermal expansion coefficient, the solid-state element device 601 with an excellent reliability can be obtained without generating any cracks. Further, since the glass sealing portion 604 and the element mounting substrate 603 are formed to have the same thermal expansion coefficient, an excellent glass adhering property can be obtained.

Further, even if a plurality of the GaN-based LED elements 102 having a high calorific value are densely mounted, a stable heat radiation can be realized by utilizing the element mounting substrate 603 composed of $Al_2O_3$. In the meantime, a serial circuit can be easily formed by pattern formation, and a wiring installation for conducting the electrolytic plating can be easily provided.

Still further, the heat generated by the light emission of the densely-mounted nine LED elements 102 can be immediately conducted to the heat sink or the like via the heat radiation pattern 636, by pulling the external wiring pattern 635 from an intermediate layer in the layers and by providing the heat radiation pattern 636 at the bottom surface. In addition, while the heat radiation pattern comprises the black W-layer 136, thereby increasing the light absorbing effect of the heat radiation pattern 636, the light reaching to the element mounting substrate 603 can be suppressed, so that the optical loss due to the heat radiation pattern 636 can be reduced. Therefore, this structure is notably advantageous in the practical applications.

In the first to seventh preferred embodiments, the LED element is used as the solid-state element however the solid-state element is not limited to the LED element. For example, an LD element or the like maybe used as the solid-state element. Other concrete and detailed structures or the like can be appropriately modified beyond controversy.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A solid-state element device, comprising:
   a solid-state element comprising a pad electrode smaller than a contact electrode, said solid-state element being flip-mounted;
   a power receiving/supplying portion for receiving/supplying a power, said power receiving/supplying portion being bonded to said solid-state element such that an element mounting surface thereof is nearly flush with a mounting surface of said solid-state element; and
   an inorganic sealing portion for sealing the solid-state element comprising an inorganic sealing material and a thermal expansion coefficient equal to that of said power receiving/supplying portion,
   wherein said inorganic sealing portion defines an air layer between said solid-state element and said power receiving/supplying portion.

2. A solid-state element device according to claim 1, wherein:
   said contact electrode has no contact with said inorganic sealing portion.

3. A solid-state element device according to claim 1, wherein:
   a distance between said mounting surface of said solid-state element and said element mounting surface of said substrate is not more than 15 µm.

4. A solid-state element device according to claim 1, wherein:
   said power receiving/supplying portion comprises a circuit pattern electrically connected to said solid-state element, and a protrusion portion for suppressing penetration of said inorganic sealing material between said power receiving/supplying portion and said solid-state element is formed in said circuit pattern.

5. A solid-state element device according to claim 1, wherein:
   said contact electrode comprises a thermal expansion coefficient equal to that of a growth substrate of said solid-state element.

6. A solid-state element device according to claim 1, wherein:
   said contact electrode comprises a transparent conductive material.

7. A solid-state element device according to claim 6, wherein:
   said transparent conductive material comprises an oxide.

8. A solid-state element device according to claim 7, wherein:
   said transparent conductive material comprises indium tin oxide (ITO).

9. A solid-state element device according to claim 1, further comprising:
   a small refractive index film which comprises a refractive index smaller than that of said inorganic sealing material and which is formed on a side of said power receiving/supplying portion of said contact electrode of said solid-state element.

10. A solid-state element device according to claim 1, wherein:
    said solid-state element comprises linearly formed first and second electrodes which are opposed to each other through a nearly rectangular-shaped light emitting region.

11. A solid-state element device according to claim 1, wherein:
said solid-state element comprises a first electrode provided at a center of a light emitting region provided nearly in rectangular shape, and a second electrode provided in a periphery of said light emitting region.

12. A solid-state element device according to claim 1, wherein:
said inorganic sealing portion comprises a phosphor.

13. A solid-state element device, comprising:
a solid-state element comprising a contact electrode corresponding to a light emitting region, and a pad electrode smaller than said contact electrode, said solid-state element being flip-mounted;
a power receiving/supplying portion for receiving/supplying a power, said power receiving/supplying portion being bonded to said solid-state element such that an element mounting surface thereof is nearly flush with a mounting surface of said solid-state element; and
an inorganic sealing portion for sealing the solid-state element comprising an inorganic sealing material and a thermal expansion coefficient equal to that of said power receiving/supplying portion,
wherein said inorganic sealing portion defines an empty space between said solid-state element and said power receiving/supplying portion.

14. A solid-state element device according to claim 13, wherein:
said contact electrode has no contact with said inorganic sealing portion.

15. A solid-state element device according to claim 13, wherein:
a distance between said mounting surface of said solid-state element and said element mounting surface of said substrate is not greater than 15 μm.

16. A solid-state element device according to claim 13, wherein:
said power receiving/supplying portion comprises a circuit pattern electrically connected to said solid-state element, and a protrusion portion for suppressing penetration of said inorganic sealing material between said power receiving/supplying portion and said solid-state element is formed in said circuit pattern.

17. A solid-state element device according to claim 13, wherein:
said contact electrode comprises a thermal expansion coefficient equal to that of a growth substrate of said solid-state element.

18. A solid-state element device according to claim 13, wherein:
said contact electrode comprises a transparent conductive material.

19. A solid-state element device according to claim 18, wherein:
said transparent conductive material comprises an oxide.

20. A solid-state element device according to claim 19, wherein:
said transparent conductive material comprises indium tin oxide (ITO).

21. A solid-state element device according to claim 13, further comprising:
a small refractive index film which comprises a refractive index smaller than that of said inorganic sealing material and which is formed on a side of said power receiving/supplying portion of said contact electrode of said solid-state element.

22. A solid-state element device according to claim 13, wherein:
said solid-state element comprises linearly formed first and second electrodes which are opposed to each other through a nearly rectangular-shaped light emitting region.

23. A solid-state element device according to claim 13, wherein:
said solid-state element comprises a first electrode provided at a center of a light emitting region provided nearly in rectangular shape, and a second electrode provided in a periphery of said light emitting region.

24. A solid-state element device according to claim 13, wherein:
said inorganic sealing portion comprises a phosphor.

25. A solid-state element device, comprising;
a solid-state element comprising a contact electrode, formed of a transparent conductive material, corresponding to a light emitting region, and a pad electrode smaller than said contact electrode, said solid-state element being flip-mounted;
a power receiving/supplying portion for receiving/supplying a power from/to said solid-state element;
an inorganic sealing portion for sealing said solid-state element comprising a thermal expansion coefficient equal to that of said power receiving/supplying portion; and
a small refractive index film comprising a refractive index smaller than that of said inorganic sealing portion, said small refractive index film being formed on a side of said power receiving/supplying portion of said contact electrode of said solid-state element.

26. A solid-state element device according to claim 25, further comprising:
an empty space defined between said small refractive index film and said power receiving/supplying portion.

27. A solid-state element device according to claim 25, wherein:
said small refractive index film comprises a dielectric layer.

28. A solid-state element device according to claim 27, wherein:
said dielectric layer comprises a material for scattering and reflecting a light emitted from said solid-state element.

29. A solid-state element device according to claim 27, wherein:
said dielectric layer comprises an $SiO_2$ layer.

30. A solid-state element device according to claim 25, wherein;
said transparent conductive material comprises an oxide.

31. A solid-state element device according to claim 30, wherein:
said transparent conductive material comprises indium tin oxide (ITO).

32. A solid-state element device according to claim 25, wherein:
said solid-state element comprises linearly formed first and second electrodes which are opposed to each other through a nearly rectangular-shaped light emitting region.

33. A solid-state element device according to claim 25, wherein said solid-state element comprises a first electrode provided at a center of a light emitting region provided nearly in rectangular shape, and a second electrode provided in a periphery of said light emitting region.

34. A solid-state element device according to claim 25, wherein:
said inorganic sealing portion comprises a phosphor.

* * * * *